(12) United States Patent
Lapstun et al.

(10) Patent No.: US 7,120,853 B2
(45) Date of Patent: *Oct. 10, 2006

(54) CYCLIC POSITION CODES

(75) Inventors: Paul Lapstun, Balmain (AU); Kia Silverbrook, Balmain (AU)

(73) Assignee: Silverbrook Research Pty Ltd., Balmain (AU)

( * ) Notice: Subject to any disclaimer, the term of this patent is extended or adjusted under 35 U.S.C. 154(b) by 328 days.

This patent is subject to a terminal disclaimer.

(21) Appl. No.: 10/473,747

(22) PCT Filed: Oct. 11, 2001

(86) PCT No.: PCT/AU01/01274

§ 371 (c)(1),
(2), (4) Date: Oct. 2, 2003

(87) PCT Pub. No.: WO02/084473

PCT Pub. Date: Oct. 24, 2002

(65) Prior Publication Data

US 2004/0148558 A1    Jul. 29, 2004

(30) Foreign Application Priority Data

Apr. 12, 2001  (AU) ...................... PR4409

(51) Int. Cl.
    *H03M 13/00*  (2006.01)
(52) U.S. Cl. ...................... 714/781; 714/755
(58) Field of Classification Search ............... 714/752, 714/758, 781
    See application file for complete search history.

(56) References Cited

U.S. PATENT DOCUMENTS 4,493,080 A     1/1985  Campbell (Continued)

FOREIGN PATENT DOCUMENTS

GB          2306669         5/1997

(Continued)

OTHER PUBLICATIONS

Dymetman, M., and Copperman, M., "Intelligent Paper, in Electronic Publishing, Artistic Imaging, and Digital Typography, Proceedings of EP '98, Mar./Apr. 1998, Springer Verlag LNCS 1375, pp. 392-406".

(Continued)

*Primary Examiner*—Shelly Chase

(57) ABSTRACT

A method of determining an offset, modulo n, of at least one point with respect to a sequence 50 of at least n symbols, the sequence consisting of a repeating codeword of a cyclic position code, the cyclic position code having length n and minimum distance $d_{min}$, the method including: obtaining, from the sequence 50 and at a position corresponding to the at least one point, a subsequence 52 of length w symbols, where $w \geq n - d_{min} + 1$; mapping the subsequence 52 to a codeword 58 of the cyclic position code most likely to match the subsequence in the presence of symbol errors 60, 62 in the subsequence; and determining an offset 54, in the sequence 50, of the codeword 58 thus obtained, and thereby determining the offset of the at least one point.

44 Claims, 11 Drawing Sheets

U.S. PATENT DOCUMENTS

| | | |
|---|---|---|
| 4,864,618 A | 9/1989 | Wright et al. |
| 4,965,503 A | 10/1990 | Watanabe et al. |
| 5,051,736 A | 9/1991 | Bennett et al. |
| 5,227,789 A | 7/1993 | Barry et al. |
| 5,412,194 A | 5/1995 | Melbye et al. |
| 5,477,012 A | 12/1995 | Sekendur |
| 5,652,412 A | 7/1997 | Lazzouni |
| 5,661,506 A | 8/1997 | Lazzouni et al. |
| 5,692,073 A | 11/1997 | Cass |
| 5,852,434 A | 12/1998 | Sekendur |
| 5,946,328 A | 8/1999 | Cox et al. |
| 6,076,734 A | 6/2000 | Dougherty |

FOREIGN PATENT DOCUMENTS

| | | |
|---|---|---|
| JP | 06313744 | 12/1994 |
| WO | WO 99/18487 | 4/1999 |
| WO | WO 99/50787 | 10/1999 |

OTHER PUBLICATIONS

Song, HY; Golomb, SW; Some new constructions for simplex codes, IEEE Transactions on Information Theory, vol. 40, Issue 2, Mar. 1994, pp. 504-507.

CYCLIC POSITION CODES

CROSS REFERENCE TO RELATED APPLICATIONS

The present application is a 371 of PCT/AU01/01274 filed on Oct. 11, 2001.

FIELD OF INVENTION

This invention relates to error-detecting and error-correcting cyclic position codes and their use in the position-coding of surfaces.

CO-PENDING APPLICATIONS

Various methods, systems and apparatus relating to the present invention are disclosed in the following co-pending applications filed by the applicant or assignee of the present invention on 27 Nov. 2000:

PCT/AU00/01442, PCT/AU00/01444, PCr/AU00/01446, PCT/AU00/01445, PCT/AU00/01450, PCT/AU00/01453, PCr/AU00/01448, PCT/AU00/01447, PCT/AU00/01459, PCT/AU00/01451, PCr/AU00/01454, PCT/AU00/01452, PCT/AU00/01443, PCT/AU00/01455, PCT/AU00/01456, PCT/AU00/01457, PCT/AU00/01458 and PCT/AU00/01449.

The disclosures of these co-pending applications are incorporated herein by cross-reference.

Various methods, systems and apparatus relating to the present invention are disclosed in the following co-pending applications filed by the applicant or assignee of the present invention on 20 Oct. 2000:

PCT/AU00/01273, PCT/AU00/01279, PCT/AU00/01288, PCT/AU00/01282, PCT/AU00/01276, PCT/AU00/01280, PCT/AU00/01274, PCT/AU00/01289, PCT/AU00/01275, PCT/AU00/01277, PCT/AU00/01286, PCT/AU00/01281, PCT/AU00/01278, PCT/AU00/01287, PCT/AU00/01285, PCT/AU00/01284 and PCT/AU00/01283.

The disclosures of these co-pending applications are incorporated herein by cross-reference.

Various methods, systems and apparatus relating to the present invention are disclosed in the following co-pending applications filed by the applicant or assignee of the present invention on 15 Sep. 2000: PCT/AU00/01108, PCT/AU00/01110 and PCT/AU00/01111. The disclosures of these co-pending applications are incorporated herein by cross-reference.

Various methods, systems and apparatus relating to the present invention are disclosed in the following co-pending applications filed by the applicant or assignee of the present invention on 30 Jun. 2000: PCT/AU00/00762, PCT/AU00/00763, PCT/AU00/00761, PCT/AU00/00760, PCT/AU00/00759, PCT/AU00/00758, PCT/AU00/00764, PCT/AU00/00765, PCT/AU00/00766, PCT/AU00/00767, PCT/AU00/00768, PCT/AU00/00773, PCT/AU00/00774, PCT/AU00/00775, PCT/AU00/00776, PCT/AU00/00777, PCT/AU00/00770, PCT/AU00/00769, PCT/AU00/00771, PCT/AU00/00772, PCT/AU00/00754, PCT/AU00/00755, PCT/AU00/00756 and PCT/AU00/00757.

The disclosures of these co-pending applications are incorporated herein by cross-reference.

Various methods, systems and apparatus relating to the present invention are disclosed in the following co-pending applications filed by the applicant or assignee of the present invention on 24 May 2000:

PCT/AU00/00518, PCT/AU00/00519, PCT/AU00/00520, PCT/AU00/00521, PCT/AU00/00522, PCT/AU00/00523, PCT/AU00/00524, PCT/AU00/00525, PCT/AU00/00526, PCT/AU00/00527, PCT/AU00/00528, PCT/AU00/00529, PCT/AU00/00530, PCT/AU00/00531, PCT/AU00/00532, PCT/AU00/00533, PCT/AU00/00534, PCT/AU00/00535, PCT/AU00/00536, PCT/AU00/00537, PCT/AU00/00538, PCT/AU00/00539, PCT/AU00/00540, PCT/AU00/00541, PCT/AU00/00542, PCT/AU00/00543, PCT/AU00/005.44, PCT/AU00/00545, PCT/AU00/00547, PCT/AU00/00546, PCT/AU00/00554, PCT/AU00/00556, PCT/AU00/00557, PCT/AU00/00558, PCT/AU00/00559, PCT/AU00/00560, PCT/AU00/00561, PCT/AU00/00562, PCT/AU00/00563, PCT/AU00/00564, PCT/AU00/00565, PCT/AU00/00566, PCT/AU00/00567, PCT/AU00/00568, PCT/AU00/00569, PCT/AU00/00570, PCT/AU00/00571, PCT/AU00/00572, PCT/AU00/00573, PCT/AU00/00574, PCT/AU00/00575, PCT/AU00/00576, PCT/AU00/00577, PCT/AU00/00578, PCT/AU00/00579, PCT/AU00/00581, PCT/AU00/00580, PCT/AU00/00582, PCT/AU00/00587, PCT/AU00/00588, PCT/AU00/00589, PCT/AU00/00583, PCT/AU00/00593, PCT/AU00/00590, PCT/AU00/00591, PCT/AU00/00592, PCT/AU00/00594, PCT/AU00/00595, PCT/AU00/00596, PCT/AU00/00597, PCT/AU00/00598, PCT/AU00/00516, PCT/AU00/00517 and PCT/AU00/00511.

The disclosures of these co-pending applications are incorporated herein by cross-reference.

BACKGROUND

Various schemes have been proposed to add a degree of "interactivity" to a printed document in conjunction with a computer system. These include printing barcodes in the document which encode universal resource locators and thereby allow printed "hyperlinks" to be activated. To make the interactivity of a printed document more seamless, and to support more sophisticated functions such as handwriting entry, it has been proposed to code the surface of a document with position-indicating or function-indicating data which is effectively invisible to the unaided human eye. The document typically includes data visible to the user, and the user ostensibly interacts with this visible data using a sensing device which in reality detects and decodes the invisible coded data.

The coded data may be in the form of discrete tags, each of which encodes data separately from other discrete tags. To decode the data in discrete tags it is first necessary to identify the discrete tag and its orientation relative to the sensing device. This usually requires the inclusion of target structures in the tag, which add to the overall size of each tag. Target structures may be shared between adjacent tags to reduce the effective overall size of each tag. One drawback of discrete tags is the need for the sensing device to have at least one complete tag in its field of view. Coupled with the possible need to allow the sensing device to be tilted with respect to the surface, the field of view of the sensing device may need to be significantly larger than the tag size, as discussed in the present applicant's co-pending PCT Application WO 00/72249.

Schemes have been proposed which use self-registering patterns and thereby dispense with explicit targets. When using a self-registering pattern, the pattern of the data itself can implicitly support operations normally supported by explicit targets, including determination of the orientation of the pattern with respect to the sensing device and determination of the alignment of the data within the pattern.

In its simplest form, a self-registering pattern consists of a rectangular or other regular grid of glyphs. Each glyph is spatially separated from its neighbors so that it can be distinguished from its neighbors. This provides the first level of registration. Grid lines can then be fitted through the points defined by the glyphs to identify the oriented (and possibly perspective-distorted) rectangular grid. This provides the second level of registration, allowing glyphs to be sampled relative to the grid. The self-registering pattern must contain a target pattern which, once located, allows the orientation and translation of the glyph grid to be determined. This provides the third and final level of registration, allowing glyph data to be assembled into data packets and interpreted. So-called m-sequences, because of their maximal-length and cyclic properties, have been proposed as the basis for various self-registering position-coding patterns.

The sensing and subsequent decoding of a position-coding pattern on a surface may be subject to error, due, for example, to the surface being damaged or dirty. Self-registering patterns do not directly support the detection and/or correction of errors.

SUMMARY OF THE INVENTION

An arbitrary number of copies of a codeword of a q-ary cyclic (n, k) code C can be concatenated to form a sequence of arbitrary length. A window of size n onto the sequence is then guaranteed to yield a codeword of C. If the code is designed to contain exactly n codewords, then the "dimension" of the code is $k=\log_q n$. If the code is designed so that all n codewords belong to the same and only cycle, then the window will yield n different codewords at n successive positions. Since there is a direct correspondence between a codeword and a position in the, sequence (modulo n), each codeword can be uniquely mapped to one of n (relative) positions. We refer to such a code as a cyclic position code. When the code is designed to have a minimum distance of $d_{min}$, any number of errors up to $d_{min}-1$ can be detected, and any number of errors up to $\lfloor(d_{min}-1)/2\rfloor$ can be corrected.

Accordingly, the invention provides, in one broad form, a method of determining a first offset, modulo n, of at least one point with respect to a first sequence of at least n symbols, the first sequence consisting of a repeating first codeword of a first cyclic position code, the first cyclic position code having length n and minimum distance $d_{min}$, the method including:

obtaining, from the first sequence and at a position corresponding to the at least one point, a first subsequence of length w symbols, where $w \geq n-d_{min}+1$;

mapping the first subsequence to a codeword of the first cyclic position code; and determining an offset, in the first sequence, of the codeword thus obtained, and thereby determining the first offset.

Mapping the first subsequence preferably includes selecting a codeword of the first cyclic position code which matches the first subsequence. If there is no match between the first sub-sequence and a codeword then an error may be flagged.

Alternatively, mapping the first subsequence includes selecting a codeword of the first cyclic position code most likely to match the first subsequence in the presence of up to $\lfloor(d_{min}-1)/2\rfloor$ symbol errors in the first subsequence. This may include selecting a codeword of the first cyclic position code closest in Hamming distance to the first subsequence. The Hamming distance is preferably defined over w coordinates of the first cyclic position code.

The first sequence is preferably represented by a first pattern disposed or formed on or in a first substrate, and the method preferably includes obtaining the first subsequence by detecting or sensing at least part of the first pattern. Successive symbols of the first sequence are preferably represented by successive parts of the first pattern arranged in a substantially linear fashion.

To allow a minimum degree of error correction, it is preferable that $w \geq n-d_{min}+2$. To allow a greater degree of error correction, it is preferable that $w \geq n$.

The method may include obtaining additional subsequences from additional sequences, and thereby additional offsets. The method may further include deriving differences between off-sets obtained from pairs of adjacent sequences.

The invention also provides, in another broad form, a method of determining a first coordinate value of at least one point with respect to a plurality of first sequences, each of the first sequences consisting of a repeating first codeword of a first cyclic position code, the first cyclic position code having length $n_1$ and minimum distance $d_{min_1}$, the method including:

obtaining, from each of $h_1$ of the first sequences and at a position corresponding to the at least one point, a respective first subsequence of length $w_1$ symbols, where $h_1 \geq 2$ and $w_1 \geq n_1-d_{min_1}+1$;

mapping each of the first subsequences to a respective codeword of the first cyclic position code;

determining an offset, in the corresponding first sequence, of each codeword thus obtained, and thereby determining a respective one of a plurality of first offsets of the at least one point;

deriving, for each of $h_1-1$ pairs of the first sequences, a difference between the corresponding pair of first offsets, and thereby deriving a respective one of a plurality of first differences; and deriving, from the plurality of first differences, the first coordinate value.

Preferably at least one of the first differences is interpreted as a digit of the first coordinate value. Preferably also, at least one of the first differences is interpreted as a marker separating the first coordinate value from an adjacent coordinate value.

This difference coding approach can also be used to encode both an explicit position and a codeword, where the codeword is used for error detection. The codeword may be encoded using one bit of each difference, for example. Such a codeword, if cyclic, can also be used to determine registration of the position data, obviating the need for an explicit marker difference. In general, a cyclic position code can be embedded in (or co-located with) other data to provide a registration signal for that data.

One or more columns (and/or rows) per coordinate may be reserved for location-specific data.

The method preferably includes determining a second coordinate value of the at least one point with respect to a plurality of second sequences, each of the second sequences consisting of a repeating second codeword of a second cyclic position code, the second cyclic position code having length $n_2$ and minimum distance $d_{min_2}$, the method including:

obtaining, from each of $h_2$ of the second sequences and at a position corresponding to the at least one point, a respective second subsequence of length $w_2$ symbols, where $h_2 \geq 2$ and $w_2 \geq n_2-d_{min_2}+1$;

mapping each of the second subsequences to a respective codeword of the second cyclic position code;

determining an offset, in the corresponding second sequence, of each codeword thus obtained, and thereby determining a respective one of a plurality of second offsets of the at least one point; and deriving, from the plurality of second offsets, the second coordinate value.

Preferably, at least one of the second offsets is interpreted as a digit of the second coordinate value. Alternatively, the method further includes deriving, for each of $h_2-1$ pairs of the second sequences, a difference between the corresponding pair of second offsets, and thereby a respective one of a plurality of second differences; and includes deriving, from the plurality of second differences, the second coordinate value.

Preferably, each of the plurality of first sequences is represented by a respective one of a plurality of first patterns disposed or formed on or in a first substrate, the method including obtaining the corresponding first subsequence by detecting or sensing at least part of the corresponding first pattern.

Preferably also, successive symbols of each of the first sequences are represented by successive parts of the corresponding first pattern arranged in a substantially linear fashion, and the first patterns are arranged in a substantially parallel and spaced apart fashion.

The first and second coordinates may define orthogonal coordinates, for example x and y coordinates in a Cartesian coordinate system. The first and second cyclic position codes used to encode orthogonal coordinates may be of the same or different length, and may be the same or different codes.

Optimal binary (q=2) cyclic position codes of various lengths are given in Table 3. The reverse, the complement and the reverse complement of the codes listed in the table are equally optimal. Many other cyclic position codes also satisfy the criteria of the invention. Many optimal codes are simplex codes.

The invention shall be better understood from the following, non-limiting, description of preferred embodiments of the invention with reference to the drawings.

DESCRIPTION OF PREFERRED AND OTHER EMBODIMENTS

Figure 1:
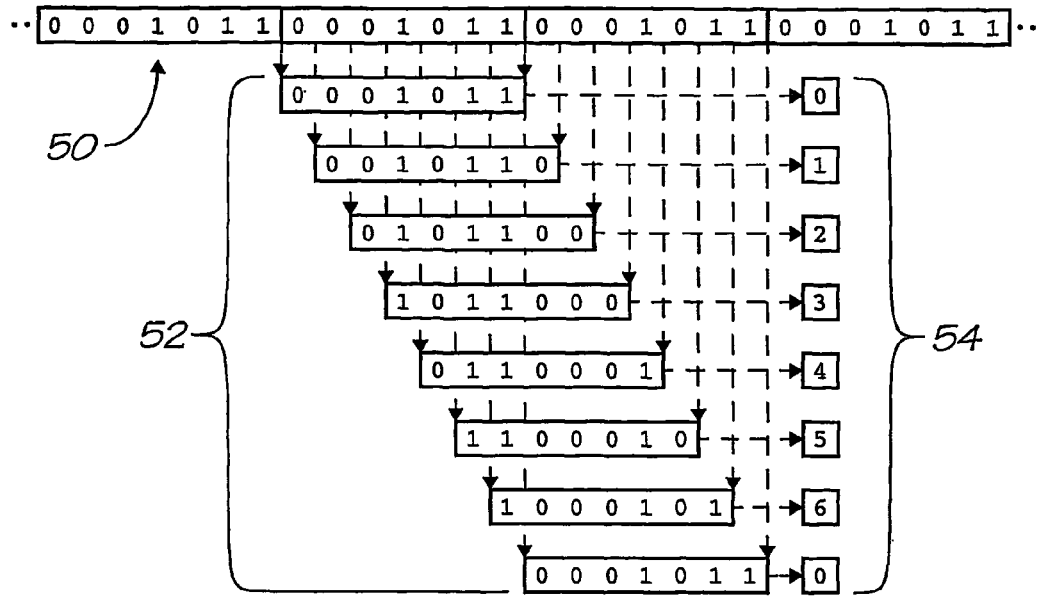
FIG. 1 shows position decoding using a 7-bit cyclic position code.

The embodiments of the invention utilize cyclic position codes in the encoding of positional and functional information on surfaces, principally in the form of self-registering patterns.

Position Coding Using M-Sequences

A linear feedback shift register (LFSR) of length k consists of k 1-bit stages numbered 0 to k−1. On each clock the content of stage 0 forms the next bit of the output sequence, the content of stage i is moved to stage i−1, and the new content of stage k−1 is a feedback bit calculated by adding together modulo 2 the previous contents of a fixed subset of the stages of the register (see Menezes, A. J., P. C. van Oorschot and S. A. Vanstone, *Handbook of Applied Cryptography*, 1997, CRC Press). A maximum-length LFSR produces as output a so-called m-sequence with a length of $2^k-1$, in which every possible non-zero register value appears once before the sequence repeats. Because each k-bit value appears exactly once in the m-sequence, a k-bit window into a known m-sequence yields a unique k-bit subsequence which in turn can be interpreted as a unique position within the m-sequence. Because of the cyclic nature of an m-sequence, a k-bit window onto a recurring m-sequence yields a locally unique position, i.e. modulo the length n of the m-sequence. Repeating or recurring m-sequences are also known as pseudo-noise (PN) sequences. The characteristics and construction of PN sequences are discussed extensively in Golomb, S. W., *Shift Register Sequences*, Aegean Park Press, 1982, the contents of which are herein incorporated by reference.

As described by F. J. MacWilliams and N. J. A. Sloane in "Pseudo-Random Sequences and Arrays" (*Proceedings of the IEEE*, Vol. 64, No. 12, December 1976, the contents of which are herein incorporated by reference), this windowing property of m-sequences can be extended to two dimensions by folding an m-sequence into a two-dimensional array. The length of the m-sequence must be of the form $n=2^{k_1 k_2}-1$, such that $n_1=2^{k_1}-1$ and $n_2=n/n_1$ are relatively prime and greater than 1. The output $n_1 \times n_2$-bit array is filled by writing the m-sequence down the main diagonal of the array and continuing from the opposite side whenever an edge is reached.

As described in PCT Application WO 92/17859 (J. Burns and S. Lloyd), the windowing property can also be extended to two dimensions by arranging a recurring m-sequence into columns and encoding a second m-sequence into the relative vertical alignment of adjacent columns. The columns are shifted cyclically to preserve the rectangular shape of the overall array. Assuming the two m-sequences hove lengths $2^{k_1}-1$ and $2^{k_2}-1$ respectively, a $k_1 \times (k_2+1)$ window into the $(2^{k_1}-1) \times 2^{k_2}$-bit array yields a unique $k_1 \times (k_2+1)$ subarray. Each $k_1$-bit column of the subarray yields a relative $k_1$-bit position, and each pair of columns yields a one-bit difference for a total of $k_2$ bits and hence a $k_2$-bit horizontal position. Once the horizontal position is known, the cumulative vertical shift associated with the horizontal position can be added to the first column's relative vertical position to yield an absolute vertical position.

By encoding $k_1$ bits rather than one bit into the relative vertical alignment of each pair of columns, i.e. by utilizing the full range of relative shifts allowed by the length of the vertical m-sequence, the position-coding density of the array can be expanded to $k_1 \times k_2$ horizontally. Each $k_1$-bit difference value then represents one element of a $k_1$-ary m-sequence.

To recover $k_1 \times k_2$ bits in both dimensions, the difference coding approach used for the horizontal dimension can also be utilized for the vertical dimension, i.e. by arranging a recurring m-sequence into rows, and encoding an m-sequence into the relative alignment of adjacent rows. The m-sequence columns and rows must be spatially interleaved in a known manner to allow decoding. An m-sequence can recur any number of times within a column (or row) to produce an overall pattern of sufficient size.

As described in U.S. Pat. No. 6,208,771 (D. A. Jared et al), orthogonal coordinates can be encoded using m-sequences placed in parallel to each other. Each m-sequence is replicated every second row, with even-numbered rows successively offset two bits to the left and odd-numbered rows successively offset two bits to the right. Even-numbered rows thereby define lines of constant coordinate at 45°, and odd-numbered rows define lines of constant coordinate at −45°, i.e. at 90° to each other; with each of their intersections thereby defining a two-dimensional position. Because the angles are induced by offsetting multiple copies of the m-sequences, the approach is highly inefficient.

A drawback of any pure m-sequence approach is that as the required position precision increases, it is increasingly expensive to translate a given subsequence (or subarray) into a position.

As described in PCT Application WO 00/73887 (P. Ericsson), the difference coding approach can be used to code a coordinate directly, i.e. the relative vertical alignment of a set of recurring m-sequence columns can code adjacent parts of a horizontal position coordinate, and the relative horizontal alignment of a set of recurring m-sequence rows can code adjacent parts of a vertical position coordinate. Unlike a pure m-sequence approach, a marker value (or range) must then be used to indicate which column (or row) separates the least-significant part of one coordinate from the most-significant part of the next coordinate. As an optimisation to the difference coding approach, only one coordinate is coded using the difference coding approach, while the other coordinate is coded directly. This is possible since once the difference-coded coordinate is decoded, the absolute alignment of the recurring m-sequences which code the orthogonal coordinate is known, rather than just their relative alignment. In the described approach, the two orthogonal sets of m-sequences are combined by pairing spatially coincident bits and representing each bit pair by a single glyph which can assume one of four possible values.

As described in PCT Application WO 92/17859 (J. Burns and S. Lloyd), so-called orientable m-sequences can be utilized in various ways to ensure that the correct orientation of a subarray can be determined. An orientable m-sequence is constructed so that if it contains a particular subsequence then it does not contain the reverse of the subsequence. When imaging an array which requires a window size of $k \times k$, a field of view with a diameter of at least $k\sqrt{2}$ is required unless the orientation of the array with respect to the image sensor is constrained.

Error Detection and Correction

Assume the data to be coded is broken into k-symbol blocks, with the q-ary symbols taken from the Galois field GF(q). The collection of all possible k-tuples $m=(m_0, m_1, \ldots, m_{k-1})$ forms a vector space over GF(q), containing $q^k$ possible vectors. A corresponding block error code C of length n consists of a set of M n-symbol codewords $\{c_0, c_1, \ldots, c_{M-1}\}$, where $M=q^k$ and $n>k$, with each codeword of the form $c=(c_0, c_1, \ldots, c_{n-1})$. Given a data block to be encoded, the encoder maps the data block onto a codeword in C. Since the collection of all possible n-tuples over GF(q) contains $q^n$ vectors, but there are only $M=q^k$ codewords, the code contains redundancy. This is expressed logarithmically by $r=n-\log_q M=n-k$, or by the code rate $R=k/n$. The code C is a linear code if it forms a vector subspace over GF(q), i.e. if it is closed under addition and under multiplication by a scalar (and thus contains the zero vector). The code is then said to have dimension k and is referred to as an (n, k) code.

The Hamming distance between two codewords is the number of symbols in which the two codewords differ. The minimum distance $d_{min}$ of a block code is the smallest Hamming distance of any pair of distinct codewords in the code. The maximum distance $d_{max}$ is the largest Hamming distance of any pair of distinct codewords in the code.

An error pattern introduces symbol errors into a codeword. It is characterized by its weight, i.e. the number of symbols it corrupts. For an error pattern to be undetectable, it must cause a codeword to look like another codeword. A code with a minimum distance of $d_{min}$ can thus detect all error patterns of weight less than or equal to $d_{min}-1$. Although a given code can detect many error patterns with greater weights, this provides a limit on the weight for which a code can detect all error patterns.

Given a sampled word possibly corrupted by an error pattern, the decoder maps the sampled word onto a codeword in C in such a way as to minimize the probability that the codeword is different from the codeword originally written, and then maps the codeword onto a data block. In the absence of a more specific characterization, it is assumed that lower-weight error patterns are more likely than higher-weight error patterns, and that all error patterns of equal weight are equally likely. The maximum likelihood written codeword is thus the codeword which is closest in Hamming distance to the sampled word. If the sampled word is closer to an incorrect codeword than the correct (written) codeword, then the decoder commits an error. Since codewords are by definition at least a distance $d_{min}$ apart, decoder errors are only possible if the weight of the error pattern is greater than or equal to $d_{min}/2$. A maximum likelihood decoder can thus correct all error patterns of weight less than or equal to $\lfloor(d_{min}-1)/2\rfloor$. Equivalently, the decoder can correct t errors so long as $2t<d_{min}$.

The minimum distance of a linear code is limited by the Singleton bound: $d_{min} \leq n-k+1$. Codes which satisfy the Singleton bound with equality are called maximum-distance separable (MDS). Reed-Solomon codes (see Wicker, S. B. and V. K. Bhargava, eds., *Reed-Solomon Codes and Their Applications*, IEEE Press, 1994, the contents of which are herein incorporated by reference) are the most commonly-used MDS codes. No binary codes are MDS.

An erasure is a symbol of a sampled word assumed to have been corrupted. Since its position in the codeword is known, it can be ignored for the purposes of decoding rather than being treated as an error. For example, the distance between the erased symbol in the sampled word and the corresponding symbol in a codeword is not included in the Hamming distance used as the basis for maximum likelihood decoding. Each erasure thus effectively reduces the minimum distance by one, i.e., in the presence off erasures, up to $\lfloor(d_{min}-f-1)/2\rfloor$ errors can be corrected. Equivalently, the decoder can correct t errors and f erasures so long as $2t+f<d_{min}$. For an MDS code this becomes $2t+f<n-k+1$.

A code is systematic if each of its codewords contains, without modification, its corresponding data block at a fixed location. It is then possible to distinguish between the data (or message) coordinates of the code and the redundancy (or parity) coordinates of the code.

The rate of a linear code can be increased by puncturing the code, i.e. by deleting one or more of its redundancy coordinates. By the deletion of g coordinates, an (n, k) code is transformed into an (n−g, k) code. The minimum distance of the punctured code is $d_{min}-g$. Clearly, if $d_{min}-g<2$, puncturing destroys the code's ability to correct even one error, while if $d_{min}-g<1$, it destroys the code's ability to detect even one error. Equivalently, the length w=n−g of the punctured code must obey $w \geq n-d_{min}+1$ to be error-detecting, and $w \geq n-d_{min}+2$ to be error-correcting. The decoder for a punctured code can simply treat deleted coordinates as erasures with respect to the original code.

A block code C is a cyclic code if for every codeword $c=(c_0, c_1, \ldots, c_{n-2}, c_{n-1}) \in C$, there is also a codeword $c'=(c_{n-1}, c_0, c_1, \ldots, c_{n-2}) \in C$, i.e. c' is a right cyclic shift of c. It follows that all n cyclic shifts of c are also codewords in C. If the number of codewords $q^k$ exceeds the length of the code n, then the code contains a number of distinct cycles, with each cycle i containing $s_i$ unique codewords, where $s_i$ divides n. If the code contains the zero vector, then the zero vector forms its own cycle.

Cyclic Position Codes

Position decoding via a k-symbol window onto a recurring m-sequence of length $n=2^k-1$ does not allow error detection or correction. However, position decoding via an n-symbol window onto a recurring cyclic codeword of length n does allow error detection and correction.

An arbitrary number of copies of a codeword of a cyclic (n, k) code C can be concatenated to form a sequence of arbitrary length. A window of size n onto the sequence is then guaranteed to yield a codeword of C. If the code is designed to contain exactly n codewords, then the dimension of the code is, by definition, $k=\log_q n$. If the code is designed so that all n codewords belong to the same and only cycle, then the window will yield n different codewords at n successive positions. Since there is a direct correspondence between a codeword and a position in the sequence (modulo n), each codeword can be uniquely mapped to one of n (relative) positions. Significantly, a position can be determined even in the presence of up to $\lfloor(d_{min}-1)/2\rfloor$ symbol errors. We refer to such a code as a cyclic position code. Any codeword of a cyclic position code defines the code. A cyclic position code is not a linear code, since it does not contain the zero vector. However, it is useful to use the terminology of linear codes in the following discussion and characterisation of cyclic position codes. Many good cyclic position codes are linear codes with the zero vector removed.

Note that the cyclic shifts of a binary m-sequence of length $2^k-1$ constitute all of the non-zero codewords of a linear cyclic code of length $n=2^k-1$, dimension k, and minimum distance $d_{min}=2^k-1$ (see F. J. MacWilliams and N. J. A. Sloane, "Pseudo-Random Sequences and Arrays", *Proceedings of the IEEE*, Vol.64, No.12, December 1976). A binary m-sequence therefore defines a cyclic position code. Note also, however, that the m-sequence-based position coding schemes described earlier do not use m-sequences as codewords, since they use a window size of k rather than a window size of n.

More generally, m-sequences define a subset of the set of simplex codes. The simplex codes have length n=4m−1 and minimum distance $d_{min}=(n+1)/2=2m$. As implied by the name, the codewords of a simplex code define the equidistant vertices of an n-simplex. The minimum and maximum distances of a simplex code are therefore the same. For n prime, the Paley construction can be used to construct a cyclic simplex code using quadratic residues (see MacWilliams, F. J. and N. J. A. Sloane, *The Theory of Error-Correcting Codes*, North-Holland, 1977, and Wicker, S. B., *Error Control Systems for Digital Communication and Storage*, Prentice Hall, 1995, the contents of both of which are herein incorporated by reference). For n prime or $n=2^k-1$, then, a simplex code is cyclic and therefore defines a cyclic position code.

A cyclic simplex code of length n=4 m−1 defines an optimal cyclic position code in the sense that it has the largest minimum distance possible not only for its length but for any length n<4(m+1)−1.

The "dimension" of a cyclic position code is fractional unless the length of the code is an integer power of the symbol size. We consider a cyclic position code "systematic" if all of its codewords are distinct in $k'=\lceil \log_q n \rceil$ symbols. An m-sequence defines a systematic cyclic position code, whereas a cyclic simplex code in general may not.

When a cyclic position code is punctured, one or more symbols are systematically deleted from each codeword of the code. However, since a punctured cyclic position code is not cyclic, the original codeword is still used to construct the arbitrary length code sequence on which punctured position decoding is based. If the punctured code has a length of n−g, then an (n−g)-symbol window is used onto a recurring cyclic codeword of length n from the original code.

Cyclic Position Code Example

By way of example, Table 1 shows the 7 codewords of a 7-bit binary cyclic position code. The code is a cyclic simplex code and is systematic. It has a minimum (and maximum) distance of 4 and therefore allows one error to be corrected.

TABLE 1

| codeword | shift |
| --- | --- |
| 0001011 | 0 |
| 0010110 | 1 |
| 0101100 | 2 |
| 1011000 | 3 |
| 0110001 | 4 |
| 1100010 | 5 |
| 1000101 | 6 |

Table 2 shows the Hamming distance between the first codeword of the code and each of the other codewords of the code, computed with a one-bit error successively in each of the seven possible locations in the codeword. In each case the corrupted (i.e. inverted) bit is indicated by ♦. Whereas the distance between the corrupted codeword and its uncorrupted original is exactly one in each case, the distance between the corrupted codeword and each of the other codewords is never less than three. Since the code (by definition) only contains a single cycle, the table demonstrates the ability of the code to correct any one-bit error in any codeword.

TABLE 2

| codeword | 0001011 | 0010110 | 0101100 | 1011000 | 0110001 | 1100010 | 1000101 |
|---|---|---|---|---|---|---|---|
| 000101◆ | 1 | 3 | 3 | 3 | 5 | 3 | 5 |
| 00010◆1 | 1 | 5 | 3 | 3 | 3 | 5 | 3 |
| 0001◆11 | 1 | 3 | 3 | 5 | 5 | 5 | 3 |
| 000◆011 | 1 | 3 | 5 | 5 | 3 | 3 | 3 |
| 00◆1011 | 1 | 3 | 5 | 3 | 3 | 5 | 5 |
| 0◆01011 | 1 | 5 | 3 | 5 | 3 | 3 | 5 |
| ◆001011 | 1 | 5 | 5 | 3 | 5 | 3 | 3 |

Figure 2:
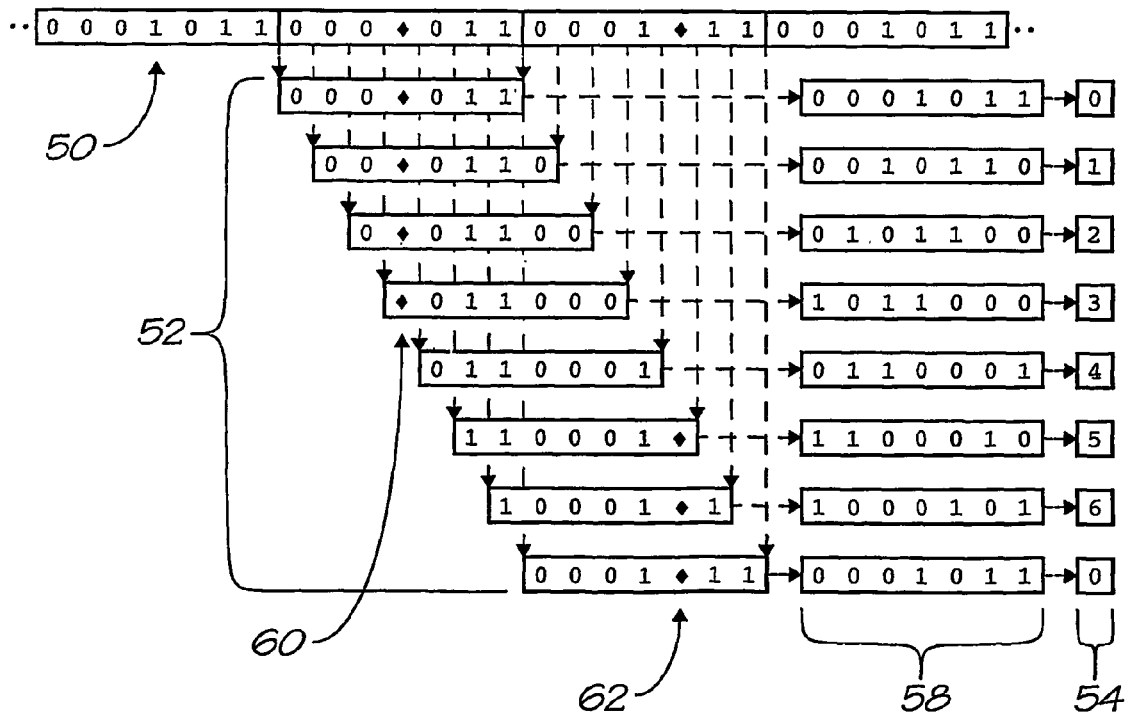
FIG. 2 shows position decoding using a 7-bit cyclic position code in the presence of errors.

FIG. 1 shows a sequence 50 consisting of the first codeword of the 7-bit binary cyclic position code repeated multiple times. FIG. 1 also shows eight adjacent 7-bit windows 52 onto the sequence, each yielding a codeword of the code and thereby a shift value 54 according to Table 1. FIG. 2 shows the same sequence 50 in the presence of two one-bit errors 60 and 62 respectively. Seven of the eight 7-bit windows 52 onto the sequence therefore also contain one-bit errors. These errors are correctable as illustrated in Table 2, yielding corresponding valid codewords 58 and thereby shift values 54 as before.

Optimal Cyclic Position Codes

For modest code lengths and symbol sizes, an optimal cyclic position code of a particular length and symbol size can be found by exhaustive search. Table 2 lists the characteristics of optimal binary cyclic position codes of various lengths, together with specific examples. Although in most cases the optimal code is systematic, for lengths of 11 and 12 a non-systematic code is optimal. Note that the optimal codes of length 7 and 15, and generally of length $n=2^k-1$, are defined by m-sequences, as discussed earlier.

TABLE 3

| n | k | $d_{min}$ | $d_{max}$ | t | $dr_{min}$ | code |
|---|---|---|---|---|---|---|
| 7 | 3 | 4 | 4 | 1 | 2 | 0001011 |
| 8 | 3 | 4 | 6 | 1 | 2 | 00010111 |
| 9 | 4 | 4 | 6 | 1 | 2 | 000010011 |
|  |  |  |  |  |  | 000010111 |
|  |  |  |  |  |  | 000100111 |
| 10 | 4 | 4 | 6 | 1 | 2 | 0000100111 |
|  |  |  | 8 |  |  | 0000101111 |
|  |  |  | 6 |  |  | 0000110111 |
|  |  |  |  |  |  | 0001010011 |
| 11 | 4 | 4 | 8 | 1 | 2 | 00001001111 |
|  |  |  | 6 |  |  | 00001010011 |
|  |  |  | 8 |  |  | 00001010011 |
|  | 5[a] | 6 | 6 | 2 | 4 | 00010010111 |
| 12 | 4 | 4 | 8 | 1 | 4 | 000100110111 |
|  | 5[a] | 6 | 8 | 2 | 4 | 000010110111 |
| 13 | 4 | 6 | 8 | 2 | 4 | 0000100110111 |
| 14 | 4 | 6 | 10 | 2 | 4 | 00001001101111 |
|  |  |  |  |  |  | 00010011010111 |
| 15 | 4 | 8 | 8 | 3 | 4 | 000010100110111 |
| 16 | 4 | 8 | 10 | 3 | 4 | 0000100110101111 |
|  |  |  |  |  |  | 0000101100111101 |
| 17 | 5 | 8 | 12 | 3 | 4 | 00000100011010111 |
|  |  |  | 10, 12 |  |  | ... |
| 18 | 5 | 8 | 12 | 3 | 6 | 000001100101101111 |
|  |  |  |  |  |  | 000010011011110101 |
|  |  |  | 14 |  |  | 000010101101001111 |
|  |  |  | 12 |  |  | 000010101111001101 |
| 19 | 5 | 10 | 10 | 4 | 8 | 0000101011110010011 |
| 20 | 5 | 10 | 14 | 4 | 6 | 00000100101011001111 |
|  |  |  | 12 |  |  | 00000101011110010011 |
|  |  |  |  |  |  | 00000101011110011011 |
|  |  |  |  |  |  | 00001010111011001111 |
| 21 | 5 | 10 | 12 | 4 | 8 | 000001010111100100011 |
| 22 | 5 | 10 | 14 | 4 | 8 | 0000010001101010011111 |
|  |  |  |  |  |  | 0000010011000111101101 |
|  |  |  |  |  |  | 0000010011011000111101 |
|  |  |  |  |  |  | 0000011001110110101111 |
| 23 | 5 | 10 | 14 | 4 | 8 | 00000100011001110101111 |
|  |  |  | 14, 16 |  |  | ... |
|  | 7[a] | 12 | 12 | 5 | 10 | 00000101001100110101111 |
| 24 | 5 | 12 | 16 | 5 | 8 | 000010010110111010001111 |
| 25 | 5 | 12 | 16 | 5 | 8 | 0000010001100101011011111 |
|  |  |  | 14, 16, 18 |  |  | ... |
| 26 | 5 | 12 | 16 | 5 | 10 | 00000100011010100111110111 |
| 27 | 5 | 12 | 16 | 5 | 10 | 000001100101101010001001111 |
|  |  |  |  |  |  | 000001101100111101001010111 |
| 28 | 6[a] | 14 | 16 | 6 | 10 | 0000000100101011101001100111 |

TABLE 3-continued

| n | k | $d_{min}$ | $d_{max}$ | t | $dr_{min}$ | code |
|---|---|---|---|---|---|---|
| 29 | 5 | 14 | 10 | | 18 | 00000010110110010101111100011 |
| | | | | | | 00000100101011111001100011101 |
| | | | | | | 00000100101011111010001100111 |
| | 13[a] | 14 | 12 | 6 | 16 | 00000100111100101011001011 |
| | 8[a] | | | | | 00001110001000100101101110111 |
| 31 | 7[a] | 16 | 16 | 7 | | 0001001000011101010001111011011 |
| 43 | 7[a] | 22 | 22 | 10 | 20 | 0011010110001000011101000111110111100101001 |
| 47 | 9[a] | 24 | 24 | 11 | 22 | 00000100001101010001101100100111010100111101111 |
| 59 | 9[a] | 30 | 30 | 14 | 28 | 00100010101101100010000110000011111001110111001 00101011101 |

[a]Not systematic.

For coding purposes, a code is considered equivalent to its reverse, its complement, and its reverse complement, so only one of these is included in the table in each case.

Although the table (mostly) lists systematic cyclic position codes, for code lengths greater than 7 there are many more non-systematic codes which are also optimal (indicated by ellipsis).

A particular cyclic position code can be punctured to reduce its length and hence its position-coding precision (and corresponding window size). Table 2 shows that the punctured code is superior to any other code of the same length when the code being punctured is a cyclic simplex code, since each cyclic simplex code in the table has a minimum distance greater by two than its predecessor in the table.

For example, the optimal (cyclic simplex) code of length 19 in the table, when punctured to a length of 18, is superior to the four optimal codes of length 18 in the table. The optimal length-18 codes have a minimum distance and minimum reverse distance of 8 and 6 respectively, while the punctured length 19 code has a superior minimum distance and minimum reverse distance of 9 and 7 respectively.

The first column of Table 4 shows the 19 codewords of the optimal length-19 code in Table 3. The second column of Table 4 shows the 19 codewords of an optimal length-18 code obtained by puncturing the length-19 code.

TABLE 4

| original (length-19) codeword | corresponding punctured (length-18) codeword |
|---|---|
| 0000101011110010011 | 000010101111001001 |
| 0001010111100100110 | 000101011110010011 |
| 0010101111001001100 | 001010111100100110 |
| 0101011110010011000 | 010101111001001100 |
| 1010111100100110000 | 101011110010011000 |
| 0101111001001100001 | 010111100100110000 |
| 1011110010011000010 | 101111001001100001 |
| 0111100100110000101 | 011110010011000010 |
| 1111001001100001010 | 111100100110000101 |
| 1110010011000010101 | 111001001100001010 |
| 1100100110000101011 | 110010011000010101 |
| 1001001100001010111 | 100100110000101011 |
| 0010011000010101110 | 001001100001010111 |
| 0100110000101011110 | 010011000010101111 |
| 1001100001010111100 | 100110000101011110 |
| 0011000010101111001 | 001100001010111100 |
| 0110000101011110010 | 011000010101111001 |
| 1100001010111100100 | 110000101011110010 |
| 1000010101111001001 | 100001010111100100 |

One design goal which might favor a particular non-systematic code is the maximization of the number of set bits in the codewords. This is relevant if the presence or absence of an undifferentiated glyph is used to represent each bit, since it can maximize our ability to discern the structure of the overall glyph array.

Since a cyclic position code of length n contains only n codewords, for modest code lengths it is tractable to decode a sampled word by calculating the Hamming distance between the sampled word and each codeword in turn, and then choosing the closest codeword. For very short codes a lookup table can also be used. Algebraic decoding can be used for longer codes (see Wicker, S. B., *Error Control Systems for Digital Communication and Storage*, Prentice Hall, 1995, and Berlekamp, E. R., *Algebraic Coding Theory*, Aegean Park Press, 1984, the contents of both of which are herein incorporated by reference). If the sampled word is equidistant from two or more codewords, then it is preferable that decoding should report an error. Encoding can similarly be performed directly (e.g. by lookup) or algebraically.

The search for an optimal cyclic position code of length n and symbol size q can proceed by generating all possible $q^n$ codewords in turn, and for each codeword defining a code which contains the n cyclic shifts of the codeword. The minimum distance and minimum reverse distance of the code are then calculated. If the code is the best found so far then it is recorded. All optimal codes can be found in two passes, i.e. a first pass to determine the characteristics of the optimal code, and the second pass to enumerate the codes which exhibit the optimal characteristics.

If the optimal cyclic position code is a cyclic simplex code then a corresponding construction technique can be used, i.e. the Paley construction for n prime, or LFSR construction for $n=2^k-1$. Note that for some k (e.g. 5), the length $n=2^k-1$ (e.g. 31) is prime, and the Paley construction can be used.

Q-ary Cyclic Position Codes

A q-ary cyclic position code of length n=q can be constructed by concatenating q distinct symbols into a codeword. The minimum (and maximum) distance of the code is equal to its length, i.e. $d_{min}=d_{max}=n$. By way of example, Table 5 shows the 7 codewords of a 7-symbol 7-ary cyclic position code with minimum distance 7. When $n=q=2^m-1$, the cyclic position code is equivalent to an (n, 1) Reed-Solomon code with the zero vector removed code in Table 5 corresponds to a (7, 1) Reed-Solomon code, for example. Whereas a q-ary cyclic position code may contain the zero symbol, the non-zero codewords of an (n, 1) Reed-Solomon code won't contain the zero symbol, since the zero symbol only appears in the zero vector. A Reed-Solomon code will also typically have a different symbol ordering.

TABLE 5

| codeword | shift |
|---|---|
| 1234567 | 0 |
| 2345671 | 1 |
| 3456712 | 2 |
| 4567123 | 3 |
| 5671234 | 4 |
| 6712345 | 5 |
| 7123456 | 6 |

A q-ary cyclic position code of length n=q can be punctured to obtain a q-ary cyclic position code of arbitrary length $n_p$<q. No matter what the punctured length, $d_{min}=n_p$.

A q-ary position code of length n>q can be designed, or derived from one cycle of a q-ary cyclic code such as a Reed-Solomon code (where k>1). When n>q, $d_{min}$<n. For MDS codes such as Reed-Solomon codes, for example, $d_{min}$=n−k+1.

Difference Coding using a Cyclic Position Code

The various m-sequence-based position coding approaches described earlier can be realized using a recurring codeword from a cyclic position code rather than a repeating m-sequence, at the expense of sampling more than k symbols to support error detection and error correction.

Figure 3:
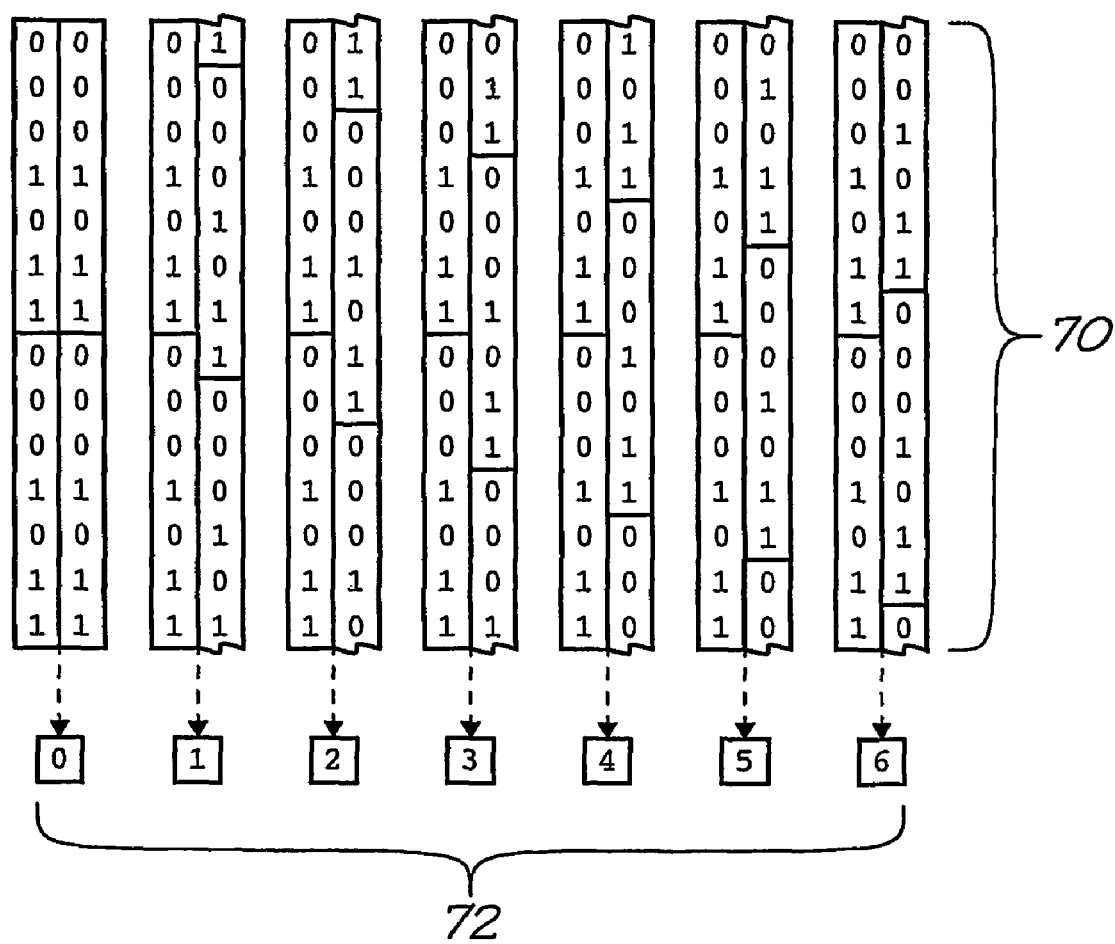
FIG. 3 shows elements of difference coding using a 7-bit cyclic position code.

By way of example, FIG. 3 shows the seven ways 70 adjacent sequences of the 7-bit code can be aligned. These provide the basic elements for difference coding. The differences 72 in vertical position are shown below each pair of columns.

Figure 4:
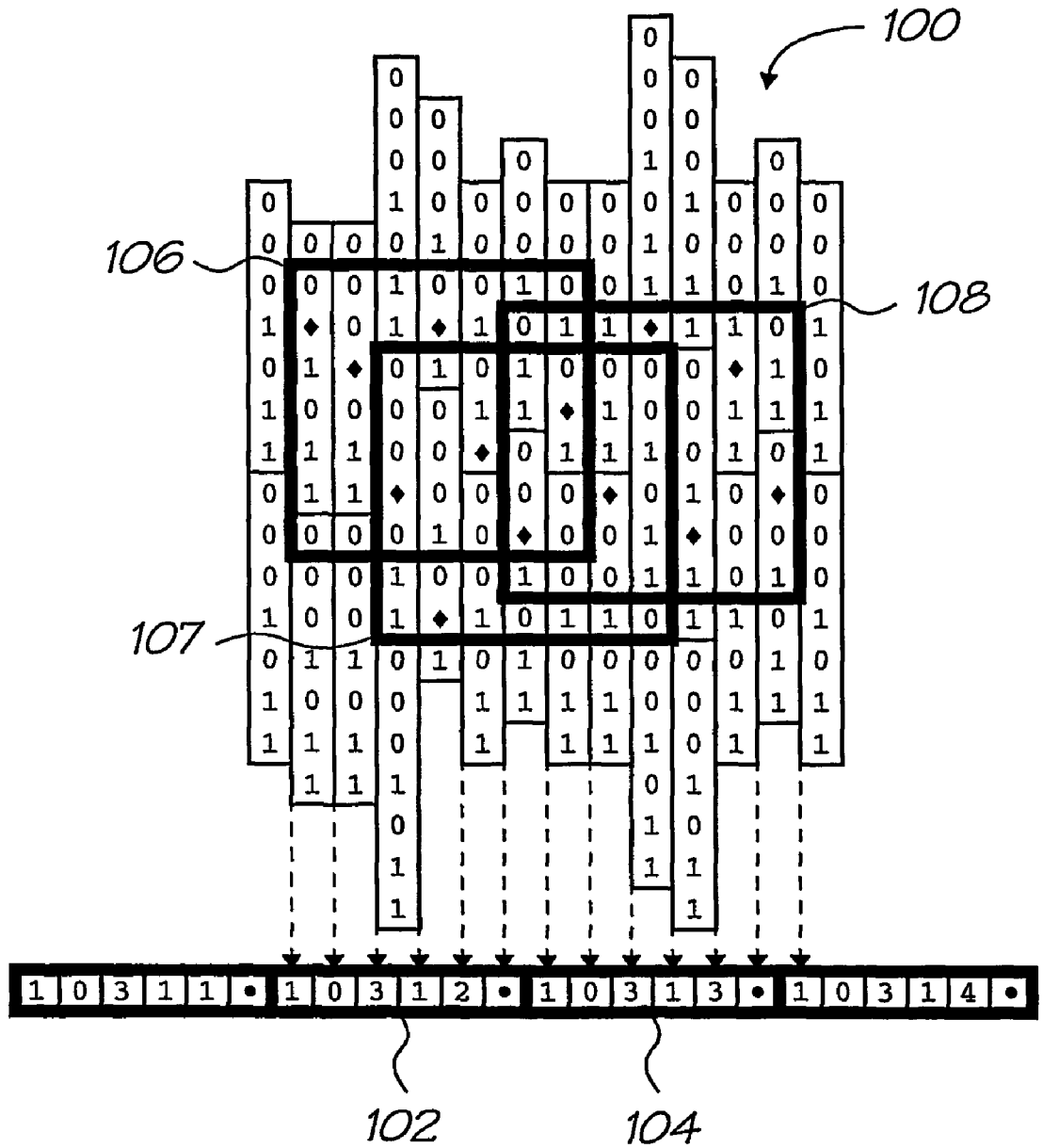
FIG. 4 shows an array of thirteen sequences of a 7-bit cyclic position code arranged in columns to enable difference coding of horizontal coordinates.

FIG. 4 shows fourteen (14) adjacent sequences 100 of the 7-bit code arranged into columns to encode, as base-6 differences, the digits of two successive horizontal coordinates, these being $10312_6$ and $10313_6$, as indicated at 102 and 104 respectively. The thin rectangles shown in the figure are included to enable the reader to easily discern each instance of the reference codeword. In practice only the bit values are encoded. As can be seen in the figure, the codeword 0001011 is repeated end on end in each column. A difference of 6 is used as a marker value (denoted by • in the figures) to separate the least-significant digit of one coordinate from the most-significant digit of the next coordinate.

Figure 5:
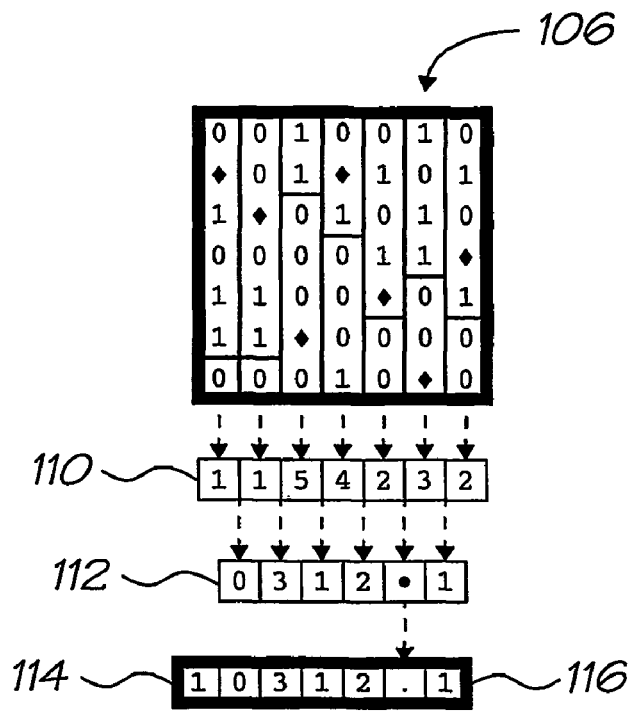
FIG. 5 shows derivation of a first coordinate position from a first one of the windows onto the array of FIG. 4.
Figure 6:
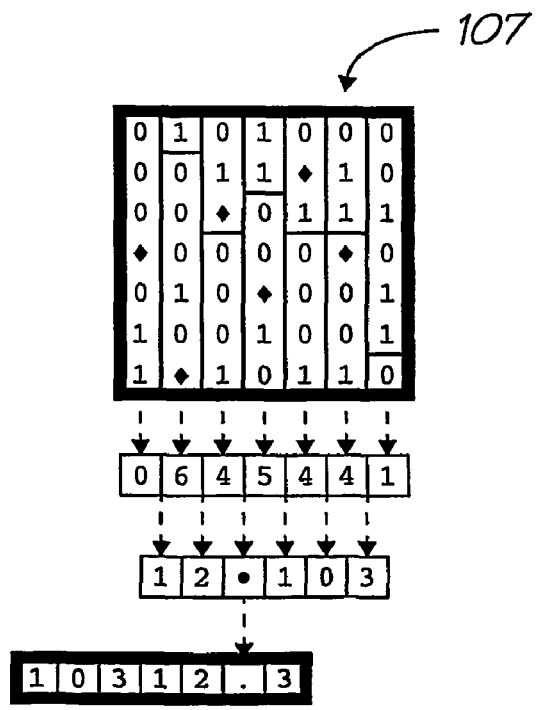
FIG. 6 shows derivation of a second coordinate position from a second one of the windows onto the array of FIG. 4.
Figure 7:
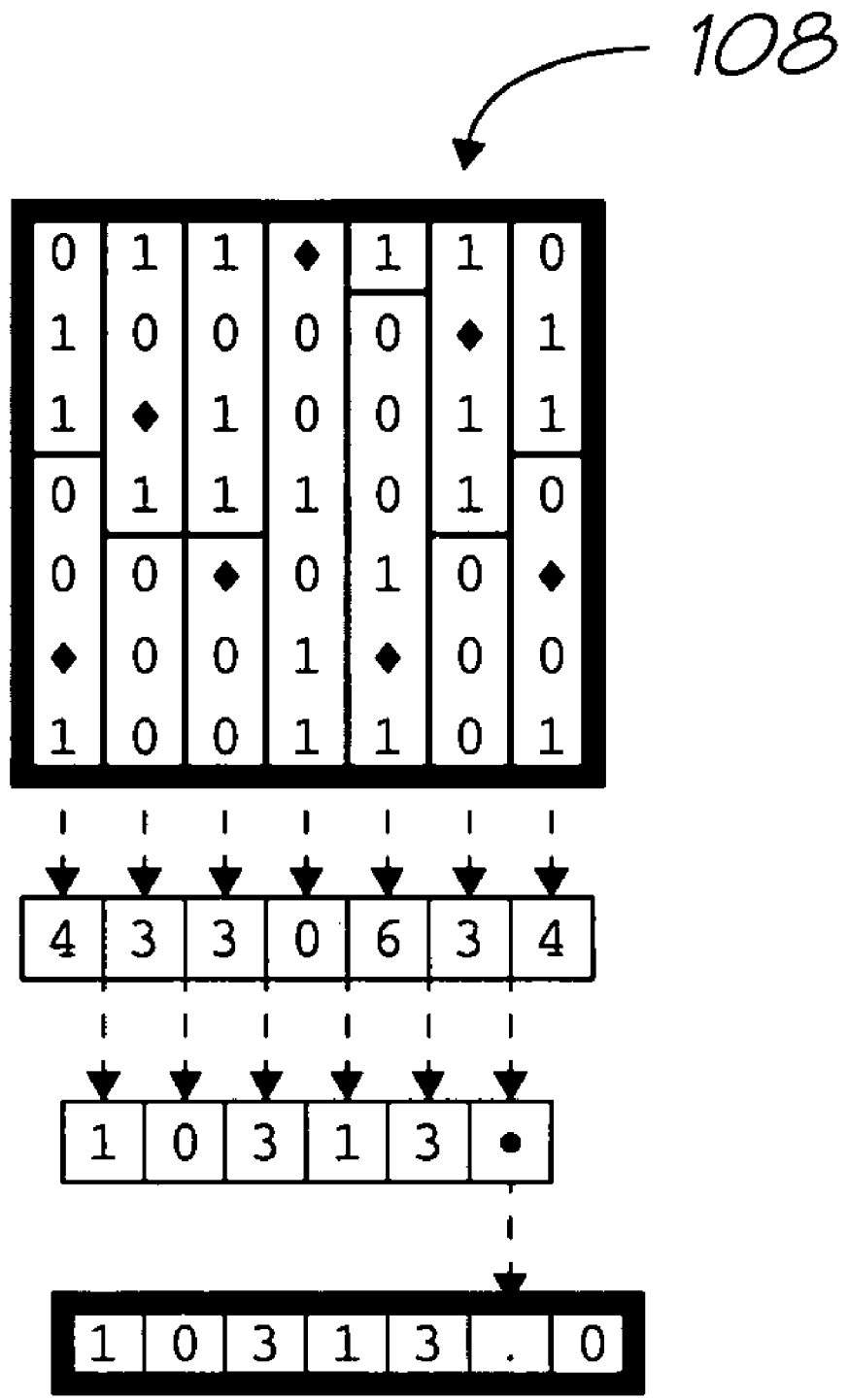
FIG. 7 shows derivation of a second coordinate position from a third one of the windows onto the array of FIG. 4.

FIG. 4 also shows three 7×7 windows 106, 107 and 108 onto the set of columns. FIGS. 5, 6 and 7 show the contents of the windows 106, 107 and 108 respectively. Each 7-bit column within each window can be interpreted as a codeword of the 7-bit code, in turn yielding a shift value and hence a relative position according to Table 1. Since a sampled 7-bit codeword may contain errors, it is first decoded to yield a valid codeword, e.g. using a maximum-likelihood decoder as described earlier (i.e. either directly or algebraically). In FIGS. 4 to 7 a number of sampled bits within each window are indicated, by way of example, as errors. Each bit denoted by ♦ indicates an error, i.e. the corresponding bit has been inverted. Since in the example there is at most one corrupted bit within a given codeword, each such error is fully correctable (as described earlier). After decoding each codeword, the difference in shift values between each pair of adjacent columns then gives a digit of a coordinate value. The difference between any two adjacent shift values, modulo 7, is invariant of the vertical position of the window, since the offset of the codewords in each column does not change in the vertical direction.

Horizontally each window yields 5 digits from the same coordinate or from two adjacent coordinates, as well as exactly one marker.

As seen in FIG. 5, window 106 yields shift values 110 of {1, 1, 5, 4, 2, 3, 2} for the seven columns sampled, when sampled from the top downwards. These in turn yield difference values 112 of {0,3, 1,2,6, 1}.

It is a simple matter to assemble a single coordinate even if the digits span two adjacent coordinates, as is the case with both windows 106 and 107. The most-significant digits to the right of the marker are simply prepended to the least-significant digits to the left of the marker.

In the example shown in FIGS. 4 to 7, and as mentioned earlier, the difference of 6 is used as the marker (denoted by • in the figures). Thus the first window's sequence of difference values 112 {0, 3, 1, 2, 6, 1} is treated as two subsequences {0, 3, 1, 2} and {1}, separated by the marker 6, and hence as two coordinate fragments $0312_6$ and $1_6$. These are converted to a coordinate value 114 of $10312_6$ by multiplying the second fragment by the precision of the first fragment (i.e. $10000_6$, or $6^4$ where 4 is the number of digits in the first fragment) and adding the fragments together. If adding 1 to the least-significant fragment would result in carry, then 1 is subtracted from the most-significant fragment.

The second window 107 yields shift values of {0, 6, 4, 5, 4, 4, 1} which in turn yield difference values of {1, 2, 6, 1, 0, 3} and a coordinate value of $10312_6$ also. The third window 108 yields shift values of {3, 4, 3, 3, 0, 6, 3} which yield difference values of {1, 0, 3, 1, 3, 6} and a coordinate value of $10313_6$.

The position of the marker in the window can be used to generate a higher-precision coordinate value, since it reflects the relative alignment of the window with respect to the coordinate. As shown in FIGS. 5 to 7, the length of the subsequence to the right of the marker is used to generate an additional fractional digit, i.e. when the marker is adjacent to the right-hand edge of the window, the window is defined to be aligned with the coordinate. Other nominal alignments are of course possible. In the first window 106 the second subsequence has length 1 and the fractional coordinate value 116 is thus $0.1_6$. In the second window 107 the second subsequence has length 3 and the fractional coordinate value is thus $0.3_6$. In the third window 108 the second subsequence has length 0 and the fractional coordinate value is thus $0.0_6$. Still higher-precision coordinate values can be generated from the relative position of the sensed coded data in the field of view of the sensing device, the perspective transform of the sensed coded data, and the known geometry of the sensing device. This is described in more detail in the present applicant's co-pending PCT Application WO 00/72287.

The marker may be any difference value, although a difference of n−1 is particularly convenient since it leaves a contiguous range of difference values 0 through n−2, each of which can be directly mapped to a base n−1 digit. In general, of course, any predetermined mapping from difference values to coordinate value can be utilized.

Spatial Arrangement

A two-dimensional position coding array consists of two orthogonal one-dimensional position coding arrays spatially combined or interleaved. A three-dimensional position coding array consists of three orthogonal one-dimensional position coding arrays spatially combined or interleaved. And so on for higher dimensions. A two-dimensional position coding array may be encoded on a surface. A three-dimensional position coding array may be encoded in a volume.

A one-dimensional position coding sequence may contain q-ary symbols, where $q \geq 2$. It is advantageous to use q distinct glyphs to represent the q distinct symbol values, to avoid the need to determine registration at the symbol level. Conversely, to reduce the number of required glyphs, q may be minimized. In the presence of spatially-coherent (burst) noise, however, a larger symbol size provides more efficient error correction.

To avoid the need to distinguish symbols belonging to orthogonal sequences, symbols may be paired and concatenated at each point of intersection between two orthogonal position coding sequences, and represented by one of a set of $q^2$ glyphs.

In the approach of PCT Application WO 92/17859 (J. Burns and S. Lloyd), the two orthogonal one-dimensional arrays are spatially interleaved and are represented by different color pairs to allow subsequent separation. Orthogonal sequences can also be distinguished by utilizing different base sequences.

In the approach of PCT Application WO 00/73887 (P. Ericsson), the two orthogonal one-dimensional arrays are combined by concatenating spatially coincident bits and representing each bit pair by a single glyph which can assume one of four possible values. The four possible values are represented by a dot in one of four positions relative to a nominal grid position. The alignment of the grid itself is determined by fitting straight lines through the off-grid dots.

Figure 8:
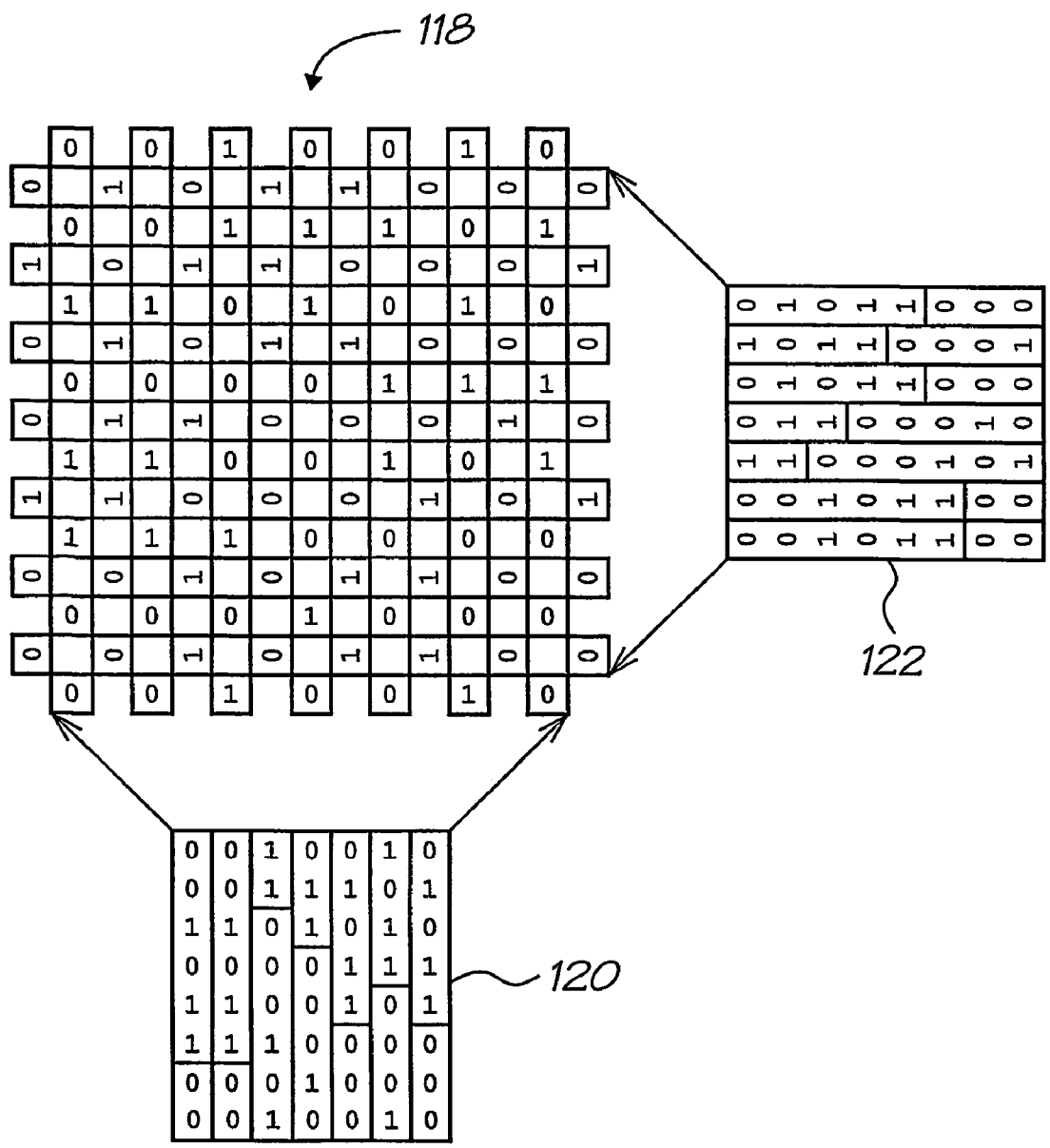
FIG. 8 shows an interleaving of two orthogonal one-dimensional position codes.
Figure 9:
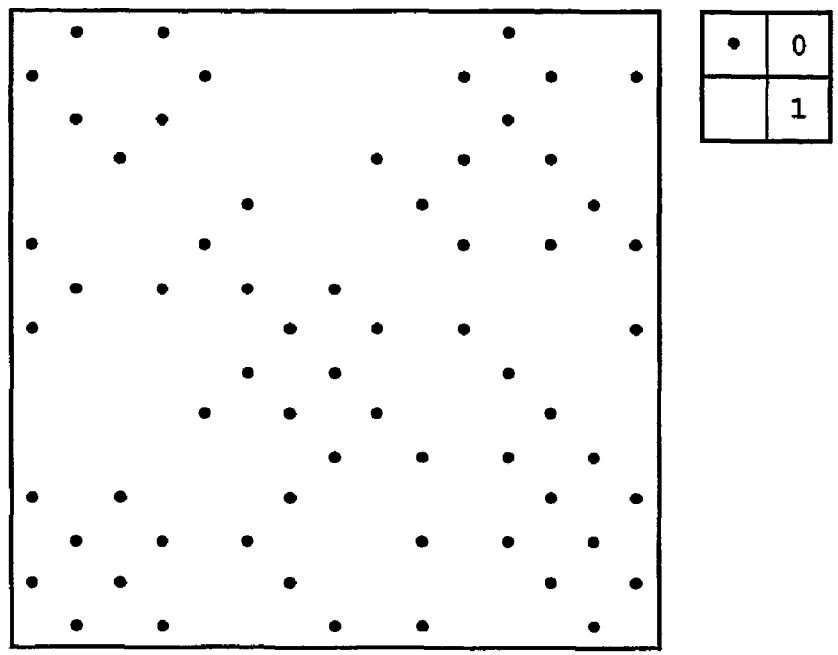
FIG. 9 shows the interleaving of FIG. 8 represented using the presence or absence of a single undifferentiated glyph.
Figure 10:
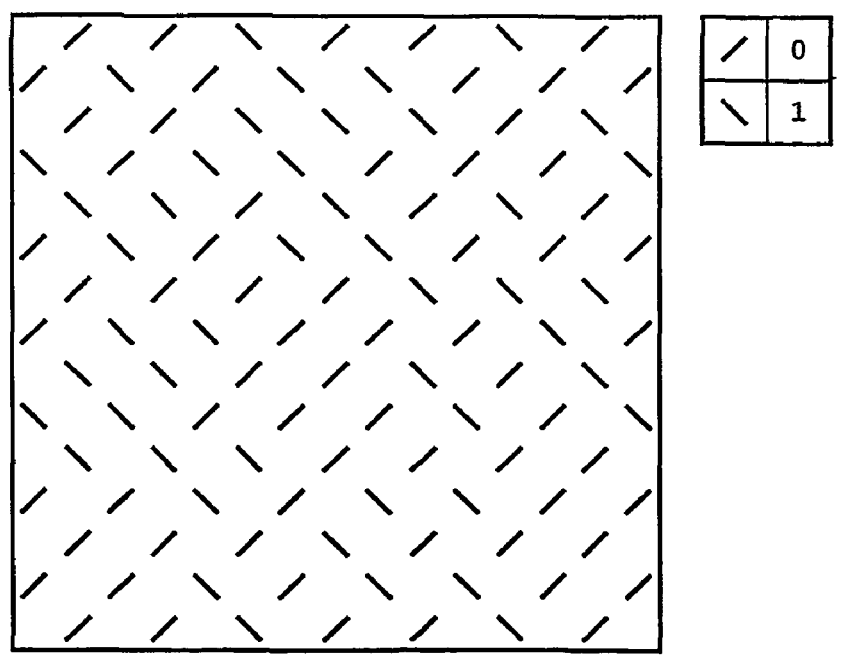
FIG. 10 shows the interleaving of FIG. 8 represented using two distinct glyphs.

FIG. 8 shows a possible spatial interleaving 118 of two orthogonal binary one-dimensional position arrays 120 and 122. To avoid the need to distinguish different glyphs, the presence and absence of single undifferentiated glyph can be used in place of two explicit glyphs, as shown in FIG. 9. Alternatively, two distinct glyphs can be used, as shown in FIG. 10.

Figure 11:
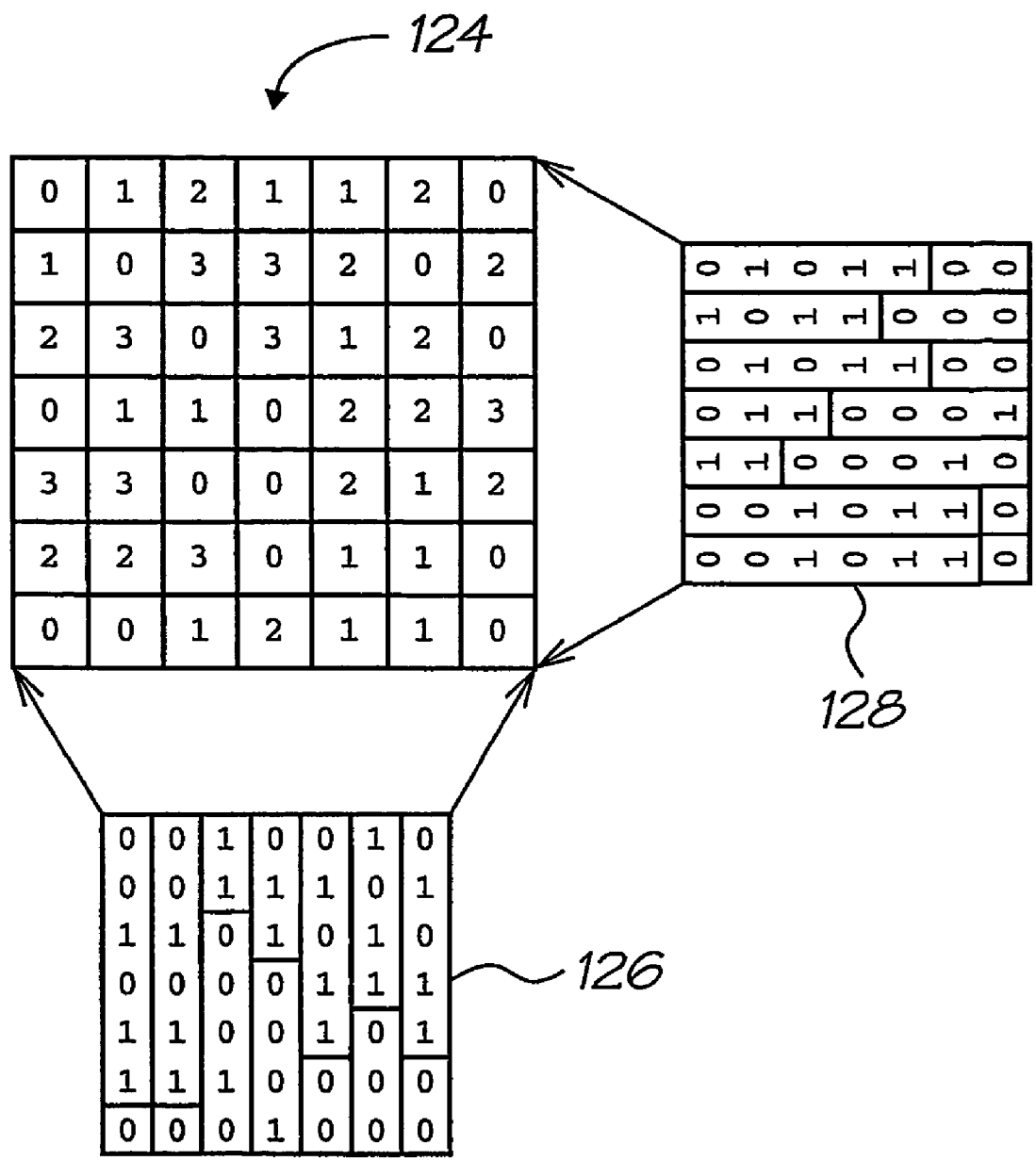
FIG. 11 shows an alternative interleaving of two orthogonal one-dimensional position codes.
Figure 12:
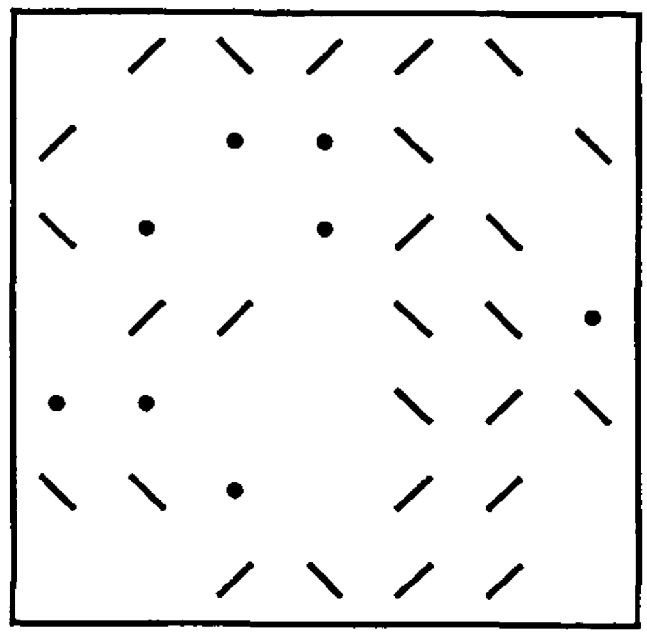
FIG. 12 shows the interleaving of FIG. 11 represented using three distinct glyphs and an empty glyph.
Figure 13:
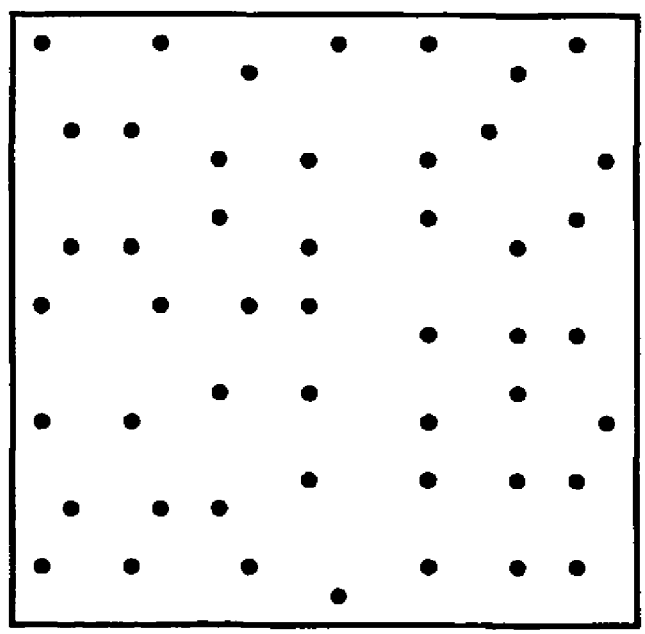
FIG. 13 shows the interleaving of FIG. 11 represented using a single undifferentiated glyph offset in one of four directions from its nominal position.

FIG. 11 shows an alternative spatial interleaving 124 of two orthogonal binary one-dimensional position arrays 126 and 128, where spatially coincident symbol values from the two arrays have been combined. FIG. 9 shows the interleaving represented using three distinct glyphs and an empty glyph. FIG. 10 shows the interleaving represented using a single undifferentiated glyph offset in one of four directions from its nominal position (as suggested in PCT Application WO 00173887).

Assuming the structure of the overall glyph array can be discerned, it can be partitioned into its two constituent orthogonal one-dimensional position coding subarrays. Each subarray of glyphs can be assigned to a set of one-dimensional position code sequences in four ways, i.e. corresponding to the four possible orientations of the subarray. Since the one-dimensional position code contains redundancy, it can be designed so that a correct assignment generates fewer errors than an incorrect assignment, even in the presence of errors due to other factors. Once the orientation of one subarray is known, the orientation of the other subarray follows. Alternatively, errors can be minimized across both subarrays to choose a correct orientation.

The number of errors resulting from certain incorrect assignments of a subarray can be quantified. To do so we define the reverse minimum distance of a one-dimensional cyclic position code.

The reverse of a code is a code containing the symbol-wise reverse of each of the codewords of the code. The minimum reverse distance $dr_{min}$ of a code is the smallest Hamming distance between a codeword in the code and a codeword in the reverse of the code.

In the absence of errors due to other factors, the number of errors resulting from a correct assignment of a subarray is zero. The number of errors resulting from incorrect an assignment due to incorrect rotation of 180° has a lower bound of $n \times dr_{min}$.

Accumulated Shift

A two-dimensional position coding array is typically generated in isolated fragments, with each fragment coding the coordinate ranges of a single surface such as a physical page. For proper continuity between fragments, the shift of the initial row and column in each fragment should reflect the accumulated shift associated with all previous rows and columns. However, since continuity between fragments is not strictly required, the first row and column of a fragment can have zero shifts.

The following discussion assumes continuity between fragments is desired. For clarity it deals with the coding of an x coordinate using differences between columns. The same approach applies to the coding of a y coordinate using differences between rows.

For a given x coordinate, each difference between a pair of earlier columns contributes to the accumulated shift and thus to the shift of the first column which encodes the coordinate. Assume each pair of columns encodes a difference between zero and b−1. Further assume that the x coordinate x is represented by p base b digits $a_i$, each encoded by a difference, such that:

$$x = \prod_{i=0}^{p-1} a_i b^i \qquad (\text{EQ 1})$$

Assume that adjacent coordinates are separated by a marker "digit" with value v.

The accumulated shift B(b, i) due to $b^i$ is given by:

$$B(b, i) = ib^{i-1} \sum_{j=0}^{b-1} j = ib^{i-1}b(b-1)/2 = ib^i(b-1)/2 \qquad (\text{EQ 2})$$

The accumulated shift $A(a_i, b, i)$ due to $a_i b^i$ is given by:

$$A(a_i, b, i) = a_i B(b, i) + b^i \sum_{j=0}^{a_i-1} j = a_i B(b, i) + b^i a_i(a_i-1)/2 \qquad (\text{EQ 3})$$

The accumulated shift up to but not including x is given by:

$$xv + \sum_{i=0}^{p-1} (A(a_i, b, i) + a_i(x \bmod b^i)) \qquad (\text{EQ 4})$$

These functions for efficiently computing accumulated shift can be conveniently implemented in a device which prints position-coded surfaces, such as described in the present applicant's co-pending PCI Applications WO 00/72126 and WO 00/72127.

Position Coding Variations

As discussed earlier, a difference coding approach can be used to encode a position explicitly or via an m-sequence. It can also be used to encode a position as a codeword to allow error detection and error correction.

A difference coding approach can also encode both an explicit position and a codeword, where the codeword is used for error detection. For example, the codeword may be encoded using one bit of each difference. Such a codeword, if cyclic, can also be used to determine registration of the position data, obviating the need for an explicit marker difference.

In general, a cyclic position code can be embedded in (or co-located with) other data to provide a registration signal for that data.

Embedded Function Flags

A difference coding approach per se does not make it easy to embed location-specific data, such as function flags (as discussed in the present applicant's co-pending PCT Application WO 01/41055), in the two-dimensional position coding array, since the two-dimensional position coding array defines two-dimensional positions through the interaction of two orthogonal one-dimensional position coding arrays.

However, one or more columns (and rows) per coordinate may be reserved for location-specific data. In this case the difference coding approach must ignore those columns (and rows) for difference coding purposes. Conversely, the location-specific data must not be allowed to induce false registration, e.g. by impersonating the marker difference.

If the differences between a set of columns (or rows) encode a codeword for the purposes of error detection and registration, as discussed in the previous section, then the codeword provides sufficient information for data columns to be ignored. However, since the data columns may contain arbitrary data, they may induce errors in the codeword. If the codeword is error-correctable and, during error correction, the only symbols in error are found to be associated with the data columns, then all is well. If errors also lie elsewhere, then the position data itself is suspect, and the decoder should report an error.

If only a few bits are required for encoding location-specific data, then the adjacent bits can be chosen in such a way as to avoid inducing a marker difference in relation to adjacent columns. This needs to take into account that the data will be error-corrected before being interpreted. This approach can obviate the need for a registration codeword.

To allow errors in location-specific data to be detected and possibly corrected, redundancy must be introduced. Since a continuous redundancy scheme based on a cyclic code doesn't support arbitrary data, location-specific data is best arranged into codewords of such a size that the sampling window is guaranteed to contain at least one complete codeword. If the sampling window has a size of n×n (i.e. to work in conjunction with a pair of orthogonal cyclic position codes of length n), then the size n' of the location-specific data codeword must obey n'≦n/2.

Rather than having two independent codewords of length n' in the two orthogonal one-dimensional position coding arrays, corresponding data from the two arrays can be combined to form a single codeword of up to length n. The burst error detection and correction capability of the single larger codeword is better than that of the two smaller codewords, but at the added cost of sampling a larger area, as discussed below.

Figure 14:
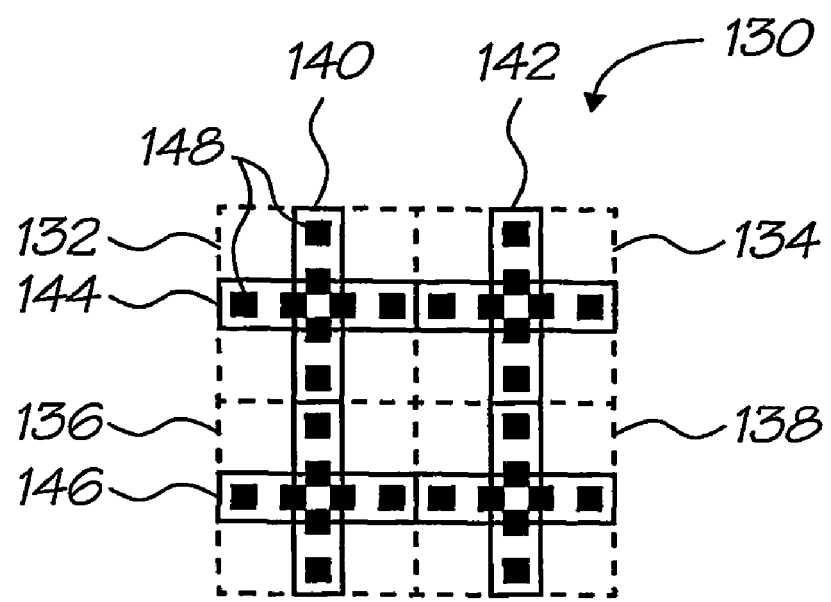
FIG. 14 shows a position-coding array having columns and rows of location-specific data.

FIG. 14 shows a portion 130 of a two-dimensional position coding array which encodes four two-dimensional positions, i.e. corresponding to four "tags" 132, 134, 136 & 138 shown with dashed outlines. It also shows, overlaid on the tags, columns 140, 142 and rows 144, 146, which are used to encode location-specific data rather than position-coding differences.

Figure 15:
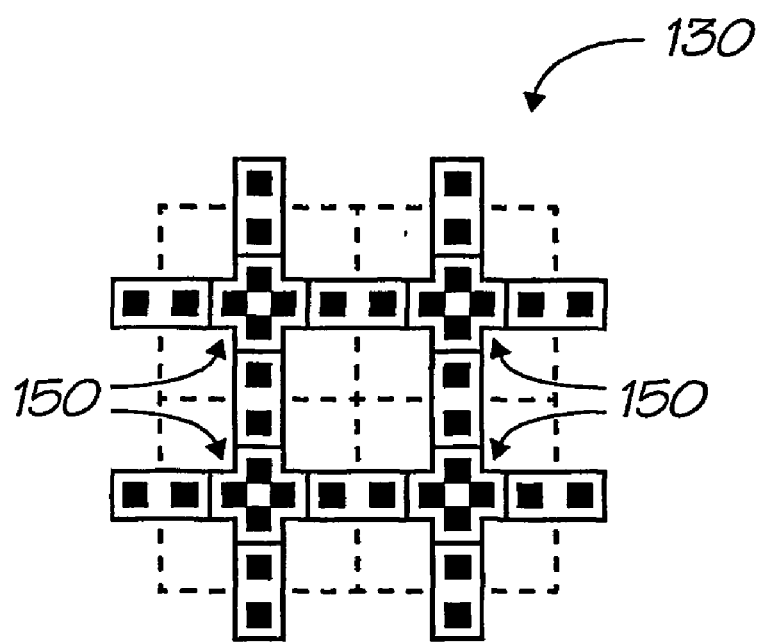
FIG. 15 shows the mapping of data from location-specific columns and rows in the array of FIG. 14 into tag-centered location-specific codewords.
Figure 16:
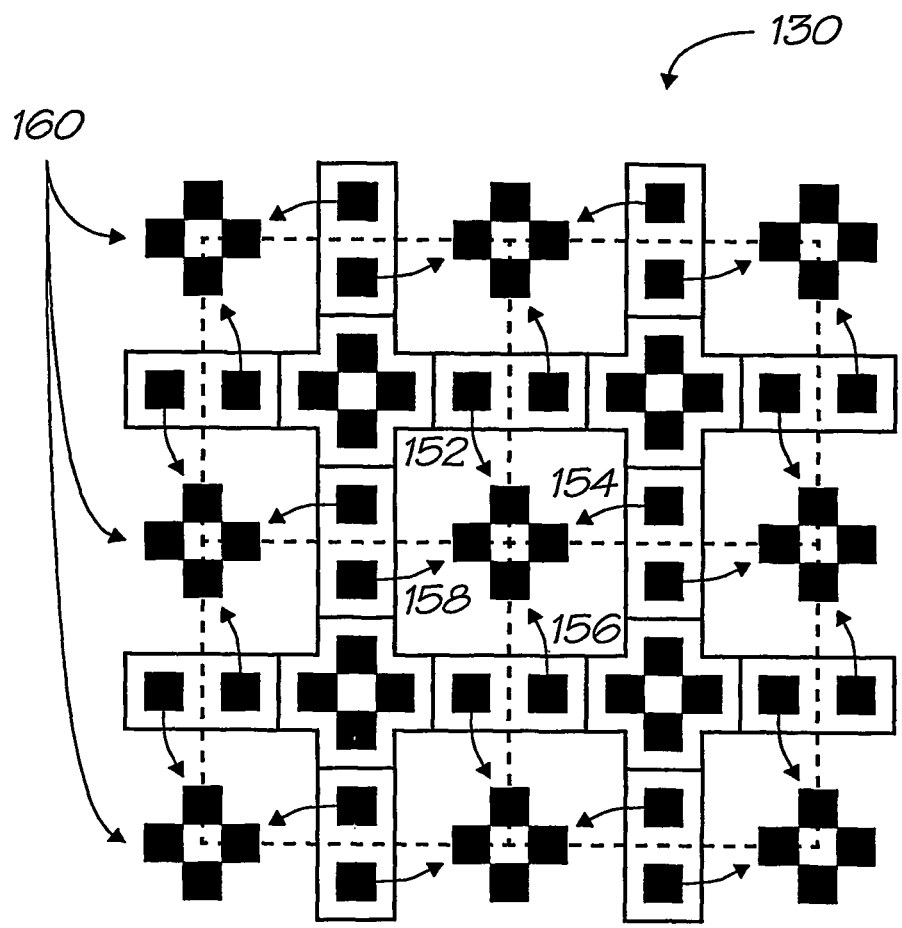
FIG. 16 shows the mapping of data from location-specific columns and rows in the array of FIG. 14 into interstitial location-specific codewords.
Figure 17:
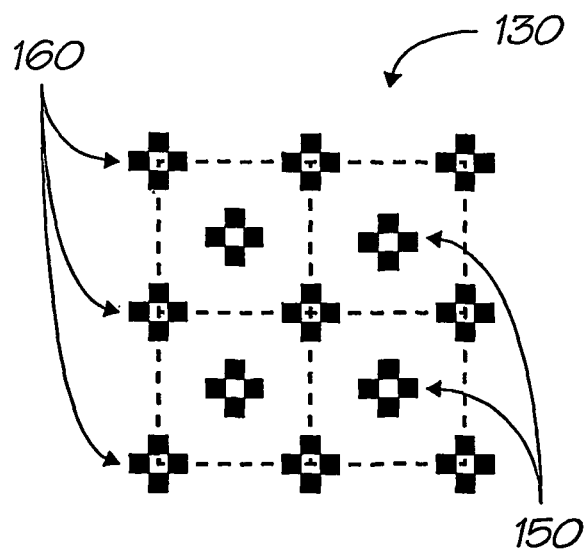
FIG. 17 shows the codewords of FIGS. 15 and 16 at their corresponding locations on the surface.

Each tag-height portion of a data column (or tag-width portion of a data row) is shown broken into four quarters, indicated by the solid squares 148. Referring to FIG. 15, where a row and column intersect in the center of a tag it is natural to combine the corresponding data quarters into a single codeword 150. Elsewhere it is natural to systematically combine four quarters 152, 154, 156 & 158 from four different rows and columns into a codeword 160 corresponding to an interstitial location. This is shown in FIG. 16, with the arrows indicating the source data quarter corresponding to each interstitial data quarter. The result is that location-specific data is coded at a frequency of $\sqrt{2}$ times the tag frequency. FIG. 17 shows only the codewords 150 and 160 so derived shown in the positions to which they correspond.

Using this scheme, location-specific data can be only be recovered at an arbitrary position if the size of the sampling window is expanded to 3n/2, assuming the size of the combined location-specific data codeword is n.

Non-Cyclic Self-Registering Patterns

Whereas the previous section considered the use of subsequences of cyclic sequences as target patterns, it is also conceivable to use a non-cyclic pattern as a target pattern. It is generally not possible to use a pure data portion of the overall pattern as a target pattern, since, as explained below, the probability of a false match is insufficiently low.

We assume for the purposes of the following analysis that a Reed-Solomon code is used to produce an error-correctable encoding of the data.

An (n, k) Reed-Solomon code is characterized by its length n and dimension k. The symbol size q of the code is given by:

$$q = \log_2(n+1) \quad \text{(EQ 5)}$$

The maximum number of correctable errors t is given by:

$$t = \left\lfloor \frac{n-k}{2} \right\rfloor \quad \text{(EQ 6)}$$

For a particular codeword, the number of "aliases" which can be decoded correctly, i.e. which contain no more than t symbols in error, is given by:

$$1 + \sum_{i=1}^{t} {}^nC_i (2^q - 1)^i \quad \text{(EQ 7)}$$

This is approximated (and bounded) by:

$${}^nC_t 2^{qt} \quad \text{(EQ 8)}$$

The number of distinct codewords containing no errors is given by:

$$2^{qk} \quad \text{(EQ 9)}$$

From (EQ 8) and (EQ 9), the number of valid codewords is approximated by:

$${}^nC_t 2^{q(k+t)} \quad \text{(EQ 10)}$$

The total number of codewords is given by:

$$2^{qn} \quad \text{(EQ 11)}$$

From (EQ 10) and (EQ 11), the probability P of a false match is therefore approximated by:

$$P = \frac{{}^nC_t 2^{q(k+t)}}{2^{qn}} \quad \text{(EQ 12)}$$

From (EQ 6) this simplifies to:

$$P = \frac{{}^nC_t}{2^{qt}} \quad \text{(EQ 13)}$$

From (EQ 13), for a (15, 5) code, P has an approximate upper bound of 1/256. Using (EQ 7) as a more accurate basis for (EQ 10) and hence (EQ 13), P is approximately 1/341.

The probability of a false match when a data codeword of arbitrary value is used as the target pattern is therefore insufficiently low.

From (EQ 8) and (EQ 11), the probability Q of a false match when a target pattern of specific value is used is approximated by:

$$Q = \frac{{}^nC_t 2^{qt}}{2^{qn}} \quad \text{(EQ 14)}$$

$$Q = \frac{{}^nC_t}{2^{q(n-t)}} \quad \text{(EQ 15)}$$

From (EQ 15), for a (15, 5) code Q has an approximate upper bound of 1/250,000,000, which may be acceptable in many applications.

It will be apparent to those skilled in the art that many obvious modifications and variations may be made to the embodiments described herein without departing from the spirit or scope of the invention.

The invention claimed is:

1. A method of determining a first offset, modulo n, of at least one point with respect to a first sequence of at least n symbols, the first sequence consisting of a repeating first codeword of a first cyclic position code, the first cyclic position code having length n and minimum distance $d_{min}$, the method including:
   obtaining, from the first sequence and at a position corresponding to the at least one point, a first subsequence of length w symbols, wherein $w \geq n-d_{min}+1$;
   mapping the first subsequence to a codeword of the first cyclic position code; and
   determining an offset, in the first sequence, of the codeword thus obtained, and thereby determining the first offset.

2. The method of claim 1 wherein mapping the first subsequence includes selecting a codeword of the first cyclic position code which matches the first subsequence.

3. The method of claim 1 wherein mapping the first subsequence includes selecting a codeword of the first cyclic position code most likely to match the first subsequence in the presence of up to $\lfloor (d_{min}-1)/2 \rfloor$ symbol errors in the first subsequence.

4. The method of claim 1 wherein if there is no match between the first subsequence and a codeword an error is flagged.

5. The method of claim 1 wherein mapping the first subsequence includes selecting a codeword of the first cyclic position code closest in Hamming distance to the first subsequence.

6. The method of claim 5 wherein the Hamming distance is defined over w coordinates of the first cyclic position code.

7. The method of claim 1 wherein the first sequence is represented by a first pattern disposed or formed on or in a first substrate, the method including obtaining the first subsequence by detecting or sensing at least part of the first pattern.

8. The method of claim 7 wherein successive symbols of the first sequence are represented by successive parts of the first pattern arranged in a substantially linear fashion.

9. The method of claim 1 wherein the first cyclic position code is a simplex code.

10. The method of claim 1 wherein the first cyclic position code is a code listed in Table 3, or is the reverse, the complement, or the reverse complement of a code listed in Table 3.

11. The method of claim 1 wherein $w \geq n-d_{min}+2$.

12. The method of claim 1 wherein $w \geq n$.

13. The method of claim 1 further including determining a second offset, modulo n, of the at least one point with respect to a second sequence of at least n symbols, the second sequence consisting of the repeating first codeword of the first cyclic position code, the method including:
   obtaining, from the second sequence and at a position corresponding to the at least one point, a second subsequence of length w symbols;
   mapping the second subsequence to a codeword of the first cyclic position code; and
   determining an offset, in the second sequence, of the codeword thus obtained, and thereby determining the second offset.

14. The method of claim 13 further including deriving a first difference between the first offset and the second offset.

15. The method of claim 14 wherein the second sequence is represented by a second pattern disposed or formed on or in the first substrate, the method including obtaining the second subsequence by detecting or sensing at least part of the second pattern.

16. The method of claim 13 further including determining a plurality of additional offsets, modulo n, of the at least one point, each with respect to one of a plurality of additional sequences of at least n symbols, each of the plurality of additional sequences consisting of the repeating first codeword of the first cyclic position code, the method including:
   obtaining, from each of the additional sequences and at a position corresponding to the at least one point, a respective additional subsequence of length w symbols;
   mapping each of the additional subsequences to a respective codeword of the first cyclic position code; and
   determining an offset, in the corresponding additional sequence, of each codeword thus obtained, and thereby determining the respective additional offset.

17. The method of claim 16 further including deriving a plurality of additional differences between pairs of the additional offsets.

18. The method of claim 17 wherein each of the plurality of additional sequence is represented by a respective one of a plurality of additional patterns disposed or formed on or in the first substrate, the method including obtaining the corresponding additional subsequence by detecting or sensing at least part of the corresponding additional pattern.

19. The method of claim 18 including detecting or sensing w symbols in each of at least w separate sequences.

20. A method of determining a first coordinate value of at least one point with respect to a plurality of first sequences, each of the first sequences consisting of a repeating first codeword of a first cyclic position code, the first cyclic position code having length $n_1$ and minimum distance, $d_{min_1}$ the method including:
  obtaining, from each of $h_1$ the first sequences and at a position corresponding to the at least one point, a respective first subsequence of length $w_1$ symbols, where $h_1 \geq 2$ and $w_1 \geq n_1 - d_{min_1}$;
  mapping each of the first subsequences to a respective codeword of the first cyclic position code;
  determining an offset, in the corresponding first sequence, of each codeword thus obtained, and thereby determining a respective one of a plurality of first offsets of the at least one point;
  deriving, for each of $h_1 - 1$ pairs of the first sequences, a difference between the corresponding pair of first offsets, and thereby deriving a respective one of a plurality of first differences; and
  deriving, from the plurality of first differences, the first coordinate value.

21. The method of claim 20 further including interpreting at least one of the first differences as a digit of the first coordinate value.

22. The method of claim 20 further including interpreting at least one of the first differences as a marker separating the first coordinate value from an adjacent coordinate value.

23. The method of claim 20 wherein $w_1 \geq n_1 - d_{min_1} + 2$.

24. The method of claim 20 wherein $w_1 \geq n_1$.

25. The method of claim 20 wherein the first cyclic position code is a simplex code.

26. The method of claim 20 wherein the first cyclic position code is a code listed in Table 3, or is the reverse, the complement, or the reverse complement of a code listed in Table 3.

27. The method of claim 20 further including determining a second coordinate value of the at least one point with respect to a plurality of second sequences, each of the second sequences consisting of a repeating second codeword of a second cyclic position code, the second cyclic position code having length $n_2$ and minimum distance, $d_{min_2}$ the method including:
  obtaining, from each of $h_2$ the second sequences and at a position corresponding to the at least one point, a respective second subsequence of length $w_2$ symbols, where $h_2 \geq 2$ and $w_2 \geq n_2 - d_{min_2} + 1$;
  mapping each of the second subsequences to a respective codeword of the second cyclic position code;
  determining an offset, in the corresponding second sequence, of each codeword thus obtained, and thereby determining a respective one of a plurality of second offsets of the at least one point; and
  deriving, from the plurality of second offsets, the second coordinate value.

28. The method of claim 27 further including interpreting at least one of the second offsets as a digit of the second coordinate value.

29. The method of claim 27 further including interpreting at least one of the second offsets as a marker separating the second coordinate value from an adjacent coordinate value.

30. The method of claim 27 further including deriving, for each of $h_2 - 1$ pairs of the second sequences, a difference between the corresponding pair of second offsets, and thereby deriving a respective one of a plurality of second differences; and deriving, from the plurality of second differences, the second coordinate value.

31. The method of claim 27 wherein $w_2 \geq n_2 - d_{min_2} + 2$.

32. The method of claim 27 wherein $w_2 \geq n_2$.

33. The method of claim 27 wherein each of the plurality of first sequences is represented by a respective one of a plurality of first patterns disposed or formed on or in a first substrate, the method including obtaining the corresponding first subsequence by detecting or sensing at least part of the corresponding first pattern.

34. The method of claim 33 wherein successive symbols of each of the first sequences are represented by successive parts of the corresponding first pattern arranged in a substantially linear fashion; and the first patterns are arranged in a substantially parallel and spaced apart fashion.

35. The method of claim 33 wherein each of the plurality of second sequences is represented by a respective one of a plurality of second patterns disposed or formed on or in the first substrate, the method including obtaining the corresponding second subsequence by detecting or sensing at least part of the corresponding second pattern.

36. The method of claim 35 wherein successive symbols of each of the second sequences are represented by successive parts of the corresponding second pattern arranged in a substantially linear fashion; the second patterns are arranged in a substantially parallel and spaced apart fashion; and the first patterns and second patterns are arranged in a substantially orthogonal fashion to each other.

37. The method of claim 27 wherein the first coordinate value and second coordinate value together define a two-dimensional coordinate.

38. The method of claim 27 wherein the second cyclic position code is a simplex code.

39. The method of claim 27 wherein the values of $n_1$ and $n_2$ are the same.

40. The method of claim 27 wherein the values of $n_1$ and $n_2$ are not the same.

41. The method of claim 27 wherein the first and second cyclic position codes are the same.

42. The method of claim 27 wherein the first and second cyclic position codes are not the same.

43. The method of claim 20 wherein the second cyclic position code is a code listed in Table 3, or is the reverse, the complement, or the reverse complement of a code listed in Table 3.

44. A method of determining a first offset of at least one point with respect to a first sequence of at least n symbols, the first sequence consisting of a repeating first codeword of a first cyclic position code, the first cyclic position code having length n, the method substantially as herein described with reference to the drawings.

* * * * *